United States Patent
Chen et al.

(10) Patent No.: US 11,817,378 B2
(45) Date of Patent: Nov. 14, 2023

(54) APPARATUS AND METHOD FOR PROVIDING A SCALABLE BALL GRID ARRAY (BGA) ASSIGNMENT AND A PCB CIRCUIT TRACE BREAKOUT PATTERN FOR RF CHIP INTERFACES

(71) Applicant: QUALCOMM INCORPORATED, San Diego, CA (US)

(72) Inventors: Nelly Chen, San Diego, CA (US); Gary Yao Zhang, San Diego, CA (US); Michael Randy May, San Jose, CA (US); Shrinivas Gopalan Uppili, San Diego, CA (US); Varin Sriboonlue, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 122 days.

(21) Appl. No.: 17/364,220

(22) Filed: Jun. 30, 2021

(65) Prior Publication Data

US 2022/0013442 A1   Jan. 13, 2022

Related U.S. Application Data

(60) Provisional application No. 63/049,530, filed on Jul. 8, 2020.

(51) Int. Cl.
*H05K 1/02* (2006.01)
*H01L 23/498* (2006.01)
(Continued)

(52) U.S. Cl.
CPC ........ *H01L 23/49816* (2013.01); *H01L 23/66* (2013.01); *H05K 1/0228* (2013.01);
(Continued)

(58) Field of Classification Search
CPC .............. H05K 1/0228; H05K 3/3436; H05K 2223/6605; H05K 2201/09227;
(Continued)

(56) References Cited

U.S. PATENT DOCUMENTS

| | | | |
|---|---|---|---|
| 6,198,635 B1 | 3/2001 | Shenoy et al. | |
| 7,161,812 B1* | 1/2007 | Thomas | H05K 7/1084 361/780 |
| 7,269,025 B2* | 9/2007 | David | H01L 23/50 257/E23.079 |
| 7,319,269 B2* | 1/2008 | Osburn | H01L 23/49838 257/E23.079 |
| 7,816,610 B2* | 10/2010 | Li | H01L 24/06 174/255 |

(Continued)

OTHER PUBLICATIONS

International Search Report and Written Opinion—PCT/US2021/040147—ISA/EPO—dated Oct. 22, 2021.

*Primary Examiner* — Hoa C Nguyen
(74) *Attorney, Agent, or Firm* — Smith Tempel Blaha LLC

(57) ABSTRACT

A pin map covers a surface area of a layer of a printed circuit board (PCB). The pin map includes a plurality of electrical designations for each pin in the pin map and a plurality of empty spaces within the pin map. Each electrical designation may be assigned to a pin on the pin map. Each electrical designation includes a positive polarity (P+) pin, a negative polarity (P−) pin, or an electrical ground (G) pin. If a space in the pin map does not have an electrical designation, then it may include an empty space/plain portion of the printed circuit board (PCB). The pin map may include a plurality of rows and a first repeating pin polarity pattern. The first repeating pin polarity pattern may include a lane unit tile. The pin map may help couple two circuit elements together that are attached to one layer of a PCB.

30 Claims, 13 Drawing Sheets

(51) Int. Cl.
  *H01L 23/66* (2006.01)
  *H05K 3/34* (2006.01)
(52) U.S. Cl.
  CPC .... *H05K 3/3436* (2013.01); *H01L 2223/6605* (2013.01); *H05K 2201/09227* (2013.01); *H05K 2201/10098* (2013.01); *H05K 2201/10734* (2013.01)
(58) Field of Classification Search
  CPC .......... H05K 2201/10098; H05K 2201/10734; H01L 23/49816; H01L 23/66
  See application file for complete search history.

(56) References Cited

U.S. PATENT DOCUMENTS

| | | | | |
|---|---|---|---|---|
| 8,294,259 | B2 * | 10/2012 | Jiang | ........................ H01L 23/50 |
| | | | | 257/773 |
| 8,324,019 | B2 * | 12/2012 | Tang | ........................ H01L 23/50 |
| | | | | 438/106 |
| 10,091,873 | B1 * | 10/2018 | Xiong | ................... H05K 1/0287 |
| 10,211,141 | B1 * | 2/2019 | Fillion | ................. H01L 23/5389 |
| 10,276,523 | B1 * | 4/2019 | Fillion | ................. H01L 23/3128 |
| 11,212,912 | B1 * | 12/2021 | Rodriguez | ............ H05K 1/0298 |
| 2015/0124419 | A1 * | 5/2015 | Wong | ...................... H05K 1/111 |
| | | | | 361/767 |
| 2019/0115292 | A1 * | 4/2019 | Morrison | ........... H01L 23/49827 |
| 2020/0211943 | A1 | 7/2020 | Langari et al. | |
| 2021/0291671 | A1 * | 9/2021 | Lu | ............................ B60L 53/12 |

\* cited by examiner

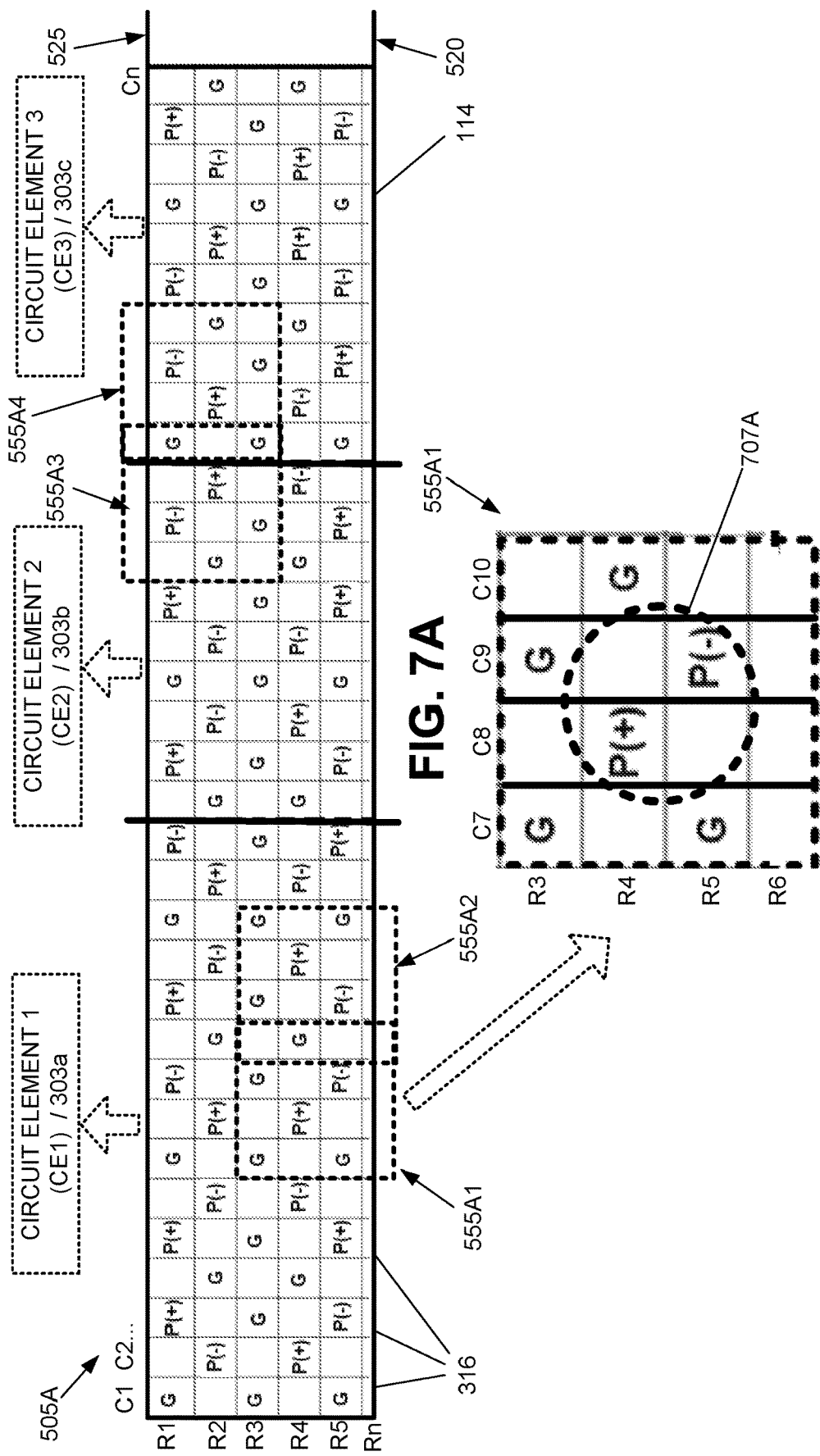

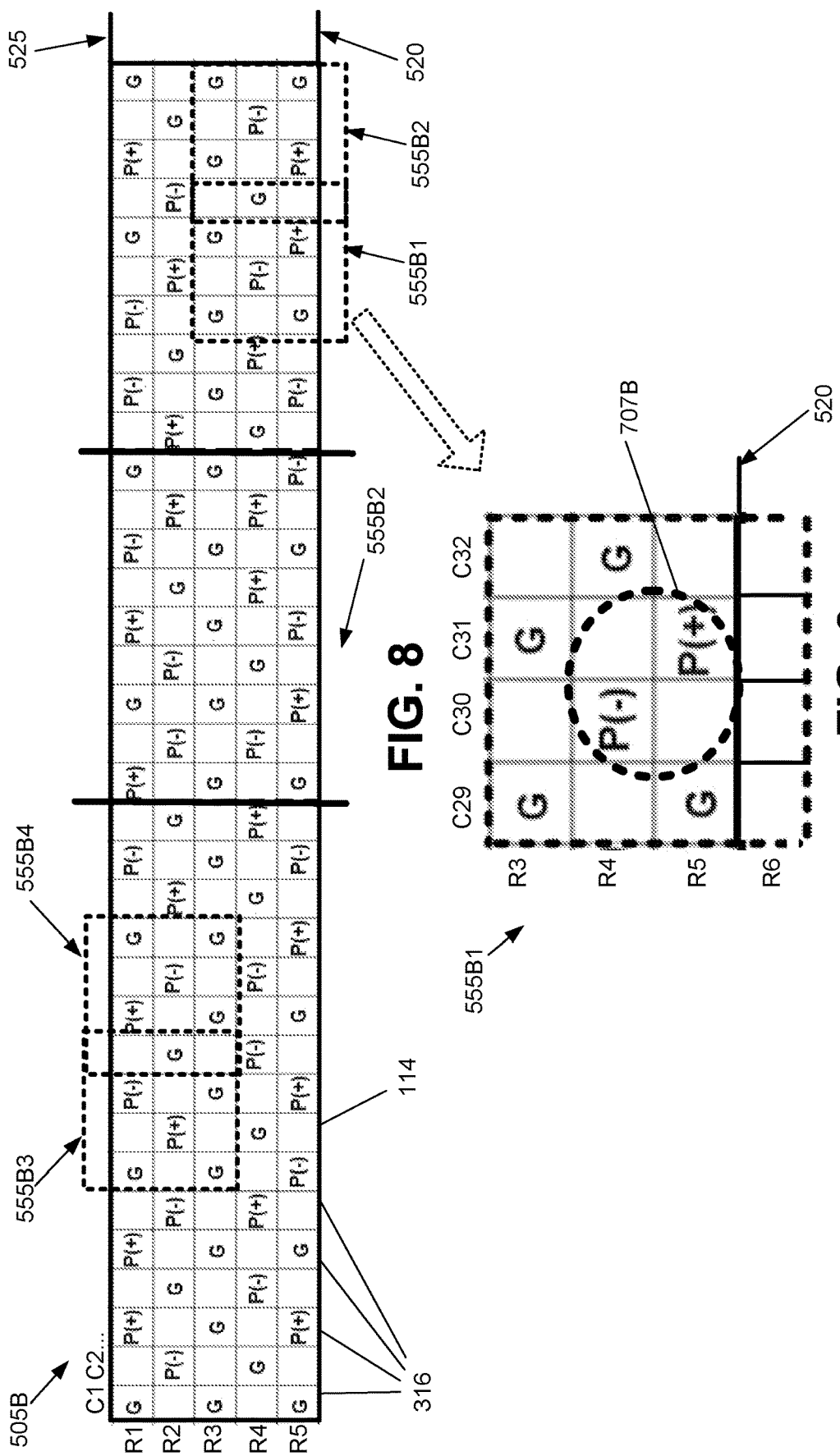

APPARATUS AND METHOD FOR PROVIDING A SCALABLE BALL GRID ARRAY (BGA) ASSIGNMENT AND A PCB CIRCUIT TRACE BREAKOUT PATTERN FOR RF CHIP INTERFACES

PRIORITY CLAIM AND RELATED APPLICATION STATEMENT

This application claims priority under 35 U.S.C. § 119(e) to and is a nonprovisional of U.S. Provisional Patent Application Ser. No. 63/049,530, filed on Jul. 8, 2020, entitled, "SYSTEM AND METHOD FOR PROVIDING A SCALABLE BALL GRID ARRAY (BGA) ASSIGNMENT AND A PCB CIRCUIT TRACE BREAKOUT PATTERN FOR RF CHIP INTERFACES," the entire contents of which are hereby incorporated by reference.

DESCRIPTION OF THE RELATED ART

As fifth generation (5G) portable computing device (PCD, i.e. mobile phone, data cards for laptops, mobile hotspots, and miscellaneous 5G modules) use cases expand and bandwidth requirements increase, the communications speed requirement between baseband integrated circuits (ICs) and radio-frequency (RF 4G/5G Sub 6))/5GmmWave IF (Intermediate frequency) ICs also have increased. Exemplary communication speeds on-chip/between chips to support communications, such as 5G signals, may include, but are not limited to, about 18.0 Gbps. Such communication speeds will likely become much higher in the near future.

To support these high speed communications, PCDs contain IC packages having one or more semiconductor dies stacked vertically and, sometimes, encased within the same molding compound of the IC package. Such multi-chip IC packages may be commonly referred to as "system-in-packages" (SIP) and chip stack "multi-chip modules" (MCM).

IC dies of these multi-chip IC packages may be electrically coupled to a printed circuit board (PCB) substrate in a ball grid array (BGA) flip chip fashion. As understood by one of ordinary skill in the art, a BGA is a type of surface-mount packaging used for ICs. And a pin map is used to plan the breakout strategy of how a particular signal or communication interface exists on printed circuit boards (PCBs). That is, the "pins" at the ends of the PCB traces are electrically connected to the "soldering balls" of a BGA. Often times, more than one layer of the printed circuit board may be needed to connect between the two ICs.

With the increased speed in data signals propagating along these communication lines, it has become more and more challenging to design a predictable IC package pin map that satisfies various metrics, among them being signal integrity targets such as, but not limited to, crosstalk or skew. System isolation target between signal lanes at higher frequencies is often not achievable unless there is solid ground return path at BGA breakout areas for via transitions.

Breakout routing for circuit traces on a PCB which support high speed communication signals is challenging if the pin map pattern is not systematic and intuitive. If pin map patterns for a PCB are not systematic and intuitive, such pin map patterns may lead to additional noise coupling and additional cost for the original equipment manufacturing (OEM) to add additional PCB layers. Signal Integrity performance of high speed communication lanes within PCB layers is key for transfer of information between a modem and a RFIC/IFIC.

Accordingly, what is needed in the art is a system and method that provides a systematic and intuitive pin map patterns which can efficiently support high speed communications between IC packages having one or more semiconductor dies stacked vertically. Such pin map patterns may help reduce signal crosstalk between communication lanes and/or skew.

SUMMARY OF THE DISCLOSURE

A method and apparatus for coupling two semiconductor dies to a layer of a printed circuit board (PCB) comprises a semiconductor die stacked vertically relative to a printed circuit board (PCB). The die is coupled to the PCB with a ball grid array (BGA). Each die may comprise a microchip and maybe coupled to the PCB using the BGA. A pin map corresponding to the BGA covers a surface area of the PCB.

The pin map comprises a plurality of electrical designations for each pin in the pin map and a plurality of empty spaces within the pin map. Each electrical designation may be assigned to a pin on the pin map. Each electrical designation may comprise one of a positive polarity (P+) pin, a negative polarity (P−) pin, and an electrical ground (G) pin. If a space in the pin map does not have an electrical designation, then it may comprise an empty space/plain portion of the printed circuit board (PCB). In alternative examples, a space without an electrical designation in the pin map may comprise a pin, but that pin may not be connected to anything/not connected to any circuit element and may be characterized as floating relative to the electrical designations noted above.

The pin map may include a plurality of rows and a first repeating pin polarity pattern. The first repeating pin polarity pattern may comprise a lane unit tile. The lane unit tile may have a central region defined by four pin map units, where two of the four pin map units comprise two pins corresponding to a differential pair of signal lanes within the PCB.

The pin map may comprise a plurality of square units wherein each square unit represents the electrical designation of a pin or an empty space. Each lane unit tile may have one pin of positive polarity (P+) and one pin of negative polarity (P−) while the remaining two subregions of the central region comprises two empty spaces of the pin map The lane unit tiles (which may have 4×4 squares) may overlap each other along a length dimension of the pin map. In another example, the lane unit tiles (which may have 4×4 squares) do not overlap each other along a length dimension of the pin map. Lane unit tiles may overlap in any dimension as long as polarity pins (signal zones) (P+/P−) do not overlap with another tile. Lane unit tiles may comprise at least four to at least sixteen squares.

The pin map may comprise two boundaries: a first boundary corresponds to an integrated circuit (IC) package edge and a second boundary corresponds to a die edge.

The semiconductor die comprises a modem and the PCB supports radio-frequency (RF) communications. The PCB may be contained within a mobile telephone.

According to an example, the pin map allows circuit traces or signal lines to be formed on one layer or geometric plane of a PCB. In this way, with a layer of the PCB having well-mapped traces/signal lines, multiple PCB layers are not needed to support communications between two dies and/or two integrated circuits or a combination thereof.

According to another example, a method for planning locations of connections between circuit elements includes selecting a first circuit element having a first ball grid array and determining if the first ball grid array comprises a narrow pitch. A first pin map having a sparse repeating pin polarity pin pattern is selected if the first ball grid array comprises a narrow pitch.

Next, a second circuit element having a second ball grid array is selected. Next, it is determined if the second ball grid array comprises a narrow pitch. A second pin map having a sparse repeating pin polarity pin pattern is selected if the second ball grid array comprises a narrow pitch.

The method further includes identifying locations on a layer of a printed circuit board where circuit traces will connect pins of first pin map with pins of second pin map and, then, placing pins on the layer of the printed board according to the selected first and second pin maps.

Subsequently, circuit traces are placed on the layer of the printed circuit board according to the identified locations such that pins and circuit traces of the layer of the printed circuit board establish electrical connections between the first circuit element and the second circuit element, whereby crosstalk between circuit traces on the layer of the printed circuit board is substantially reduced.

According to another example, a first pin map having a dense repeating pin polarity pattern is selected if the first ball grid array comprises a broad pitch. Similarly, a second pin map having a dense repeating pin polarity pattern is selected if the second ball grid array comprises a broad pitch.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 7A illustrates a first exemplary embodiment of a pin map for a ball grid array (BGA) coupling, similar to the pin map illustrated in FIG. 5;

FIG. 7B illustrates a magnification of the square shaped, lane unit tile/repeating pin polarity pattern highlighted in FIG. 7A;

FIG. 8 illustrates a second exemplary embodiment of a pin map for a ball grid array (BGA) coupling, similar to the pin maps illustrated in FIGS. 5, 7A, and 7B;

FIG. 9 illustrates a magnification of the square shaped, lane unit repeating pin polarity pattern highlighted in FIG. 8;

DETAILED DESCRIPTION

The word "exemplary" is used herein to mean "serving as an example, instance, or illustration." Any aspect described herein as "exemplary" is not necessarily to be construed as preferred or advantageous over other aspects.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component.

Figure 1:
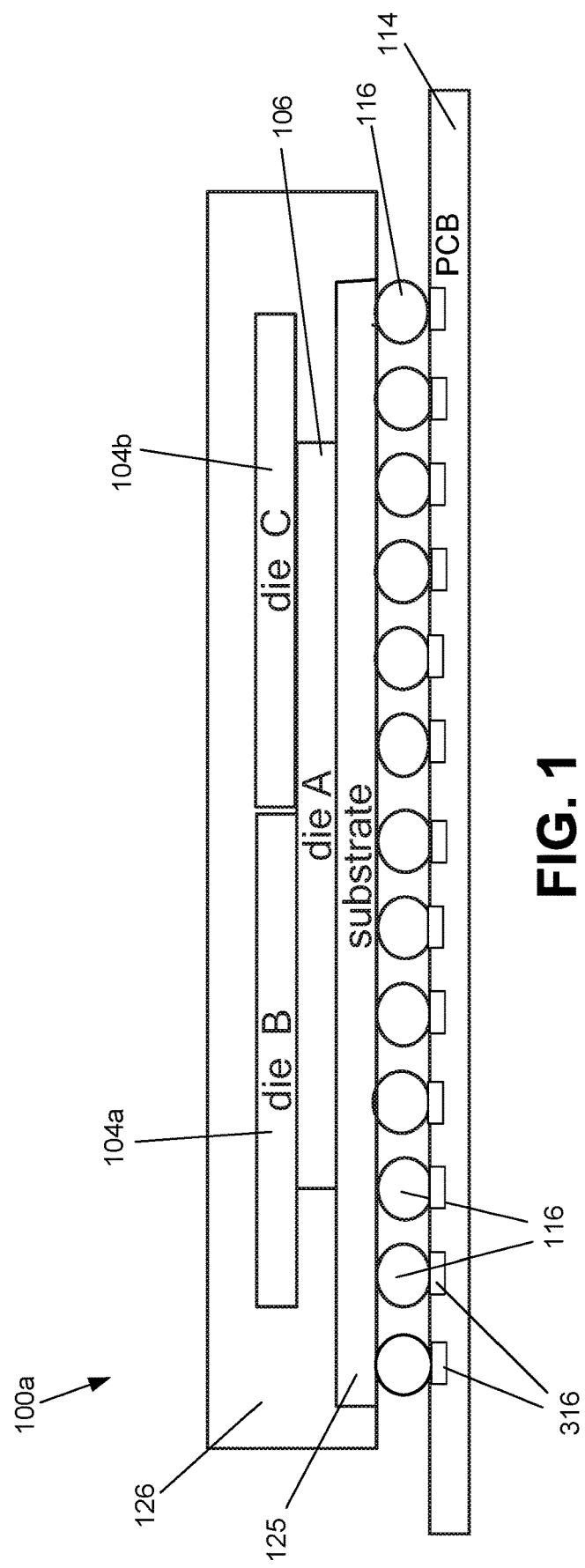
FIG. 1 illustrates a schematic, cross-sectional side view of a stacked multi-chip IC package coupled to a printed circuit board (PCB) substrate in a ball grid array (BGA) flip chip fashion.

Referring initially to FIG. 1, illustrates a schematic, cross-sectional side view of a stacked multi-chip IC package 100a coupled to a PCB substrate 114 with a ball grid array (BGA). The BGA may support a flip chip arrangement of how the multi-chip IC package 100a is coupled to the PCB substrate 114.

A flip chip arrangement, as understood by one of ordinary skill in the art, may include the following sequence of events of how a package or chip 100a is coupled to a PCB substrate 114: A solder ball 116 may be deposited on each of the pads (not shown in FIG. 1 but present on surface of the substrate 125) of the chip 100a, in a process called wafer bumping. The chip 100a is then flipped and positioned (as shown in FIG. 1) so that the solder balls 116 are facing the pins or connectors 316 of the traces of the PCB substrate 114. The solder balls 116 are then remelted (typically using hot air reflow) to the pins 316 present on the PCB substrate 114. The mounted chip 100a may be underfilled using an electrically-insulating adhesive.

The two level IC package or chip 100a comprises a level-one IC die A 106 (also referred to herein as "bottom IC die") and two (2) level-two IC dies B, C 104a, 104b all of which may be made of semiconductor materials, such as, but not limited to, silicone and/or germanium. The IC dies 106, 104a, 104b may be any type of circuit element, such as an IC, SoC, or processing entity, such as, but not limited to, processing circuits (i.e. radio-frequency ICs, such as modems, baseband ICs), memory circuits, or a combination thereof.

In one aspect, the level-one IC die 106 is an IC that is substantially a processing circuit, like a modem chip, and the level-two dies 104a, 104b may comprise memory circuits, such as double data rate type three (DDR3) synchronous dynamic random access memory (SDRAM) circuits. Of course, in other aspects, the dies 106, 104a, 104b may be other types of processing and/or memory circuits.

The level-one IC die 106 includes a plurality of integrated circuit components (e.g., transistors, capacitors, inductors, resistors, etc.). Similarly, the level-two IC dies 104a, 104b each include a plurality of integrated circuit components (e.g., transistors, capacitors, inductors, resistors, etc.).

The level-one IC die 106 and level two IC dies 104a, 104b may be coupled to a substrate 125. An epoxy and/or resin molding compound 126 encases the dies 106, 104a, 104b, the substrate 125 to form the package 100a.

The bottom of the substrate 125 may be coupled to a plurality of electrical conductors 116. The electrical conductors 116 are coupled to one layer of the printed circuit board 114. Specifically, the electrical conductors 116 may be coupled to metal pins 316 positioned on a top side 115 of the PCB 114. The metal pins 316 will be described in further detail below.

The electrical conductors 116 may comprise soldering balls, and thus the IC package 100a may be electrically coupled to the substrate 114 (and pins 316) in a ball grid array (BGA) flip chip fashion as understood by one of ordinary skill in the art. However, the electrical conductors 116 are not limited to soldering balls, and may be any metal, metal alloy, or conductive element that is capable of readily transmitting an electrical signal. For example, the electrical conductors 116 may be, but are not limited to, soldering bumps, pillars, pins, stud bumps, and/or stacks of stud bumps.

Figure 2:
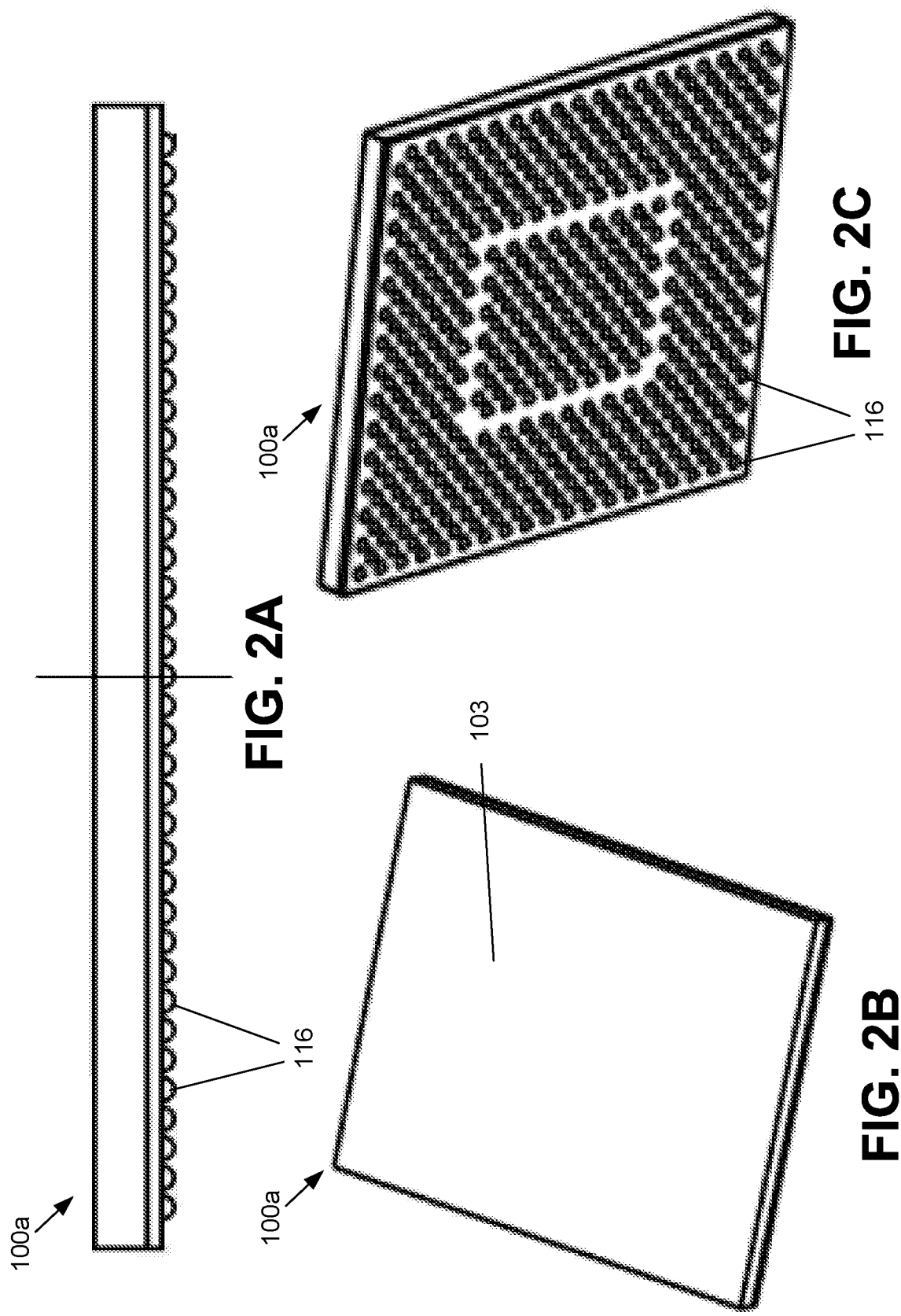
FIG. 2A illustrates a side view of the IC package of FIG. 1 and its electrical conductors.
FIG. 2B illustrates an isometric/perspective, elevational view of the IC package and specifically, the side of the IC package opposite to the electrical conductors which is empty/blank.
FIG. 2C illustrates another isometric/perspective view of the package of FIG. 1 and specifically, it shows the side of the package which has the conductors arranged in a ball grid array (BGA)

Referring now to FIG. 2A, this figure illustrates a side view of the IC package 100a of FIG. 1 and its electrical conductors 116. These electrical conductors 116 may be arranged in a ball grid array (BGA) as described above and shown in more detail in FIG. 2C. FIG. 2B illustrates an isometric/perspective, elevational view of the IC package 100a and specifically, the side of the IC package 100a opposite to the electrical conductors 116 which is empty/blank/clear of any objects.

Referring now to FIG. 2C, this figure illustrates another isometric/perspective view of the package 100a of FIG. 1 and specifically, it shows the side of the package 100a which has the conductors 116 arranged in a ball grid array (BGA). The method and system described in this disclosure focuses on the pin map 505 (see FIG. 5) which identifies the physical locations of the pins 316 that are present on one layer of the printed circuit board (PCB) 114 and the conductors 116 on the package (see FIG. 1 and FIG. 5).

Figure 3:
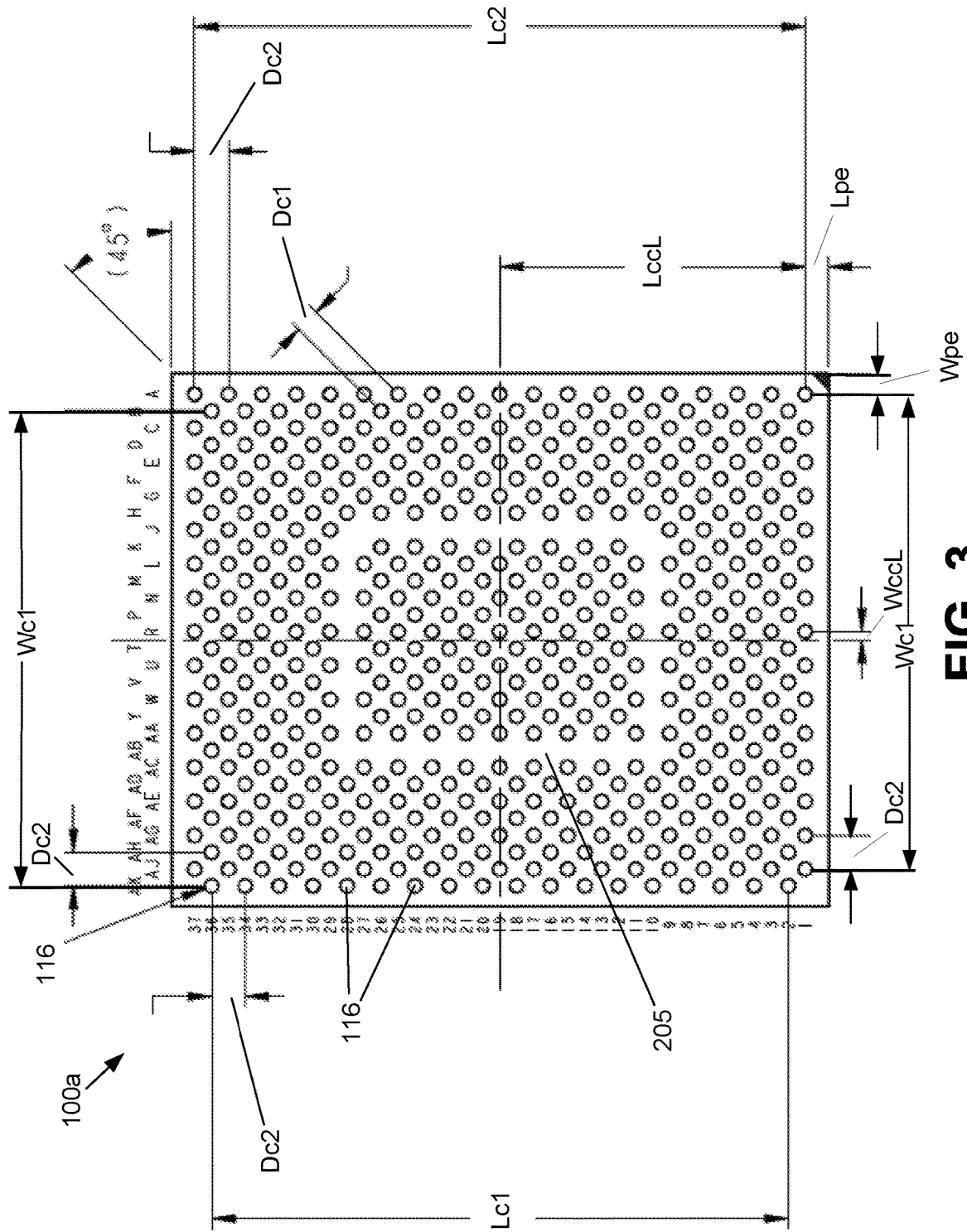
FIG. 3 illustrates a more detailed bottom view of the IC package of FIG. 1 and FIG. 2C which has the conductors.

Referring now to FIG. 3, this figure illustrates a more detailed bottom view of the IC package 100a of FIG. 1 and FIG. 2C which has the conductors 116. The conductors 116 are in fixed positions since they couple to other conductors (not visible in this figure) which are present in the substrate 125 of the IC package 100a. As described above, substrate 125 supports electrical connections to the first level IC die A 106 and the two second level IC dies B, C 104a, 104b shown in FIG. 1.

The conductors 116 will couple to the pins 316 present in the PCB 114 as shown in FIG. 1. The pins 316 and conductors 116 form a bald grid array (BGA). Within the BGA, a moat 205 may be formed. Moat 205 is a region that generally does not comprise any conductors 116. The moat 205 is optional and may or may not be used depending upon the types and applications of the IC dies A 106, B 104a, and C 104b.

The conductors 116 are usually arranged in predetermined manner to maximize the number of conductors 116 that can be placed on this bottom side of the IC package 100a and which will appropriately couple to the conductors of both the substrate 125 within the IC package 100a and with the pins on the PCB 114. The conductors 116 are usually positioned relative to each other based on the size of each conductor and based on the surface area of this bottom side of the IC package 100a.

Exemplary dimensions are illustrated in FIG. 3. This disclosure is not limited to these dimensions illustrated. Dimension smaller and larger are well within the scope of this disclosure as understood by one of ordinary skill in the art.

According to the illustrated exemplary embodiment, each conductor 116 may comprise a diameter having a magnitude between about 0.035 mm and 0.035 mm, and specifically a diameter of about 0.20 mm. However, other sizes are possible and included with the scope of this disclosure.

The conductors 116 are arranged in rows and columns along the bottom surface of the IC package 100a. Each column (see letter designations AK-A at top of IC package 100a) of conductors 116 is positioned off-set relative to another column based on the diagonal distance Dc1 between conductors 116. Similarly, each row (see number designations 1-37 on side of IC package 100a) of conductors 116 is positioned off-set relative to another column based on the diagonal distance Dc1 between conductors 116 The diagonal distance Dc1 may have an exemplary magnitude of about 0.35 mm.

Meanwhile, the distance Dc2 between conductors 116 within the same row and within the same column may comprise an exemplary magnitude of 0.496 mm. Generally, the dimension Dc2 will be greater than the distance Dc1.

An exemplary length dimension Lc1 between a conductor 116 located at position (36, AK) and a conductor 116 located at position (2, AK) may comprise an exemplary magnitude of about 8.432 mm. In the exemplary embodiment illustrated in FIG. 3, seventeen conductors 116 may span along this length dimension Lc1.

An exemplary width dimension Wc1 between a conductor 16 located at position (36, AK) and a conductor located at position (36, B) may comprise an exemplary magnitude of about 6.944 mm. In the exemplary embodiment illustrated in FIG. 3, fourteen conductors 116 may span along this width dimension Wc1.

An exemplary width dimension WccL between a conductor 116 located at position (1, R) and a vertical geometrical center line (cL) may comprise an exemplary magnitude of about 0.124 mm. Meanwhile, an exemplary width dimension Wpe between a conductor 116 located at position (1, A) and the package edge (pe) may comprise an exemplary magnitude of about 0.304 mm.

And an exemplary length dimension Lpe between a conductor at position (1, A) and the package edge (pe) may comprise an exemplary magnitude of about 0.336 mm. An exemplary length dimension LccL between a conductor at position (1, A) and a horizontal geometric center line (cL) may comprise an exemplary magnitude of about 4.464 mm.

An exemplary length dimension Lc2 between a conductor at position (37, A) and a conductor at position (1, A) may comprise an exemplary magnitude of about 8.928 mm. In the exemplary embodiment illustrated, eighteen conductors 116 may span along this length dimension Lc2.

As noted above, these dimensions of FIG. 3 (and all parts of this disclosure) are merely given as examples. Other magnitudes greater or smaller than these dimensions are possible and are included within the scope of this disclosure.

Figure 4:
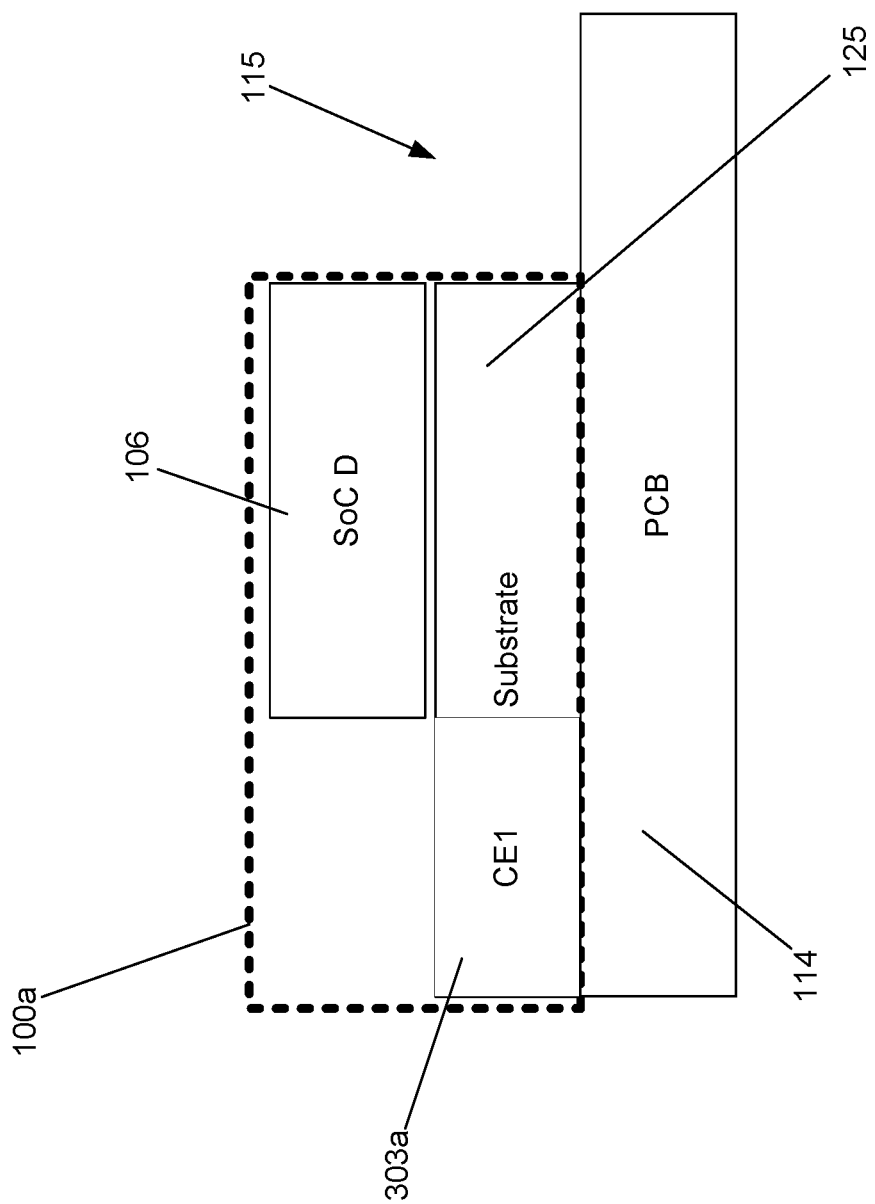
FIG. 4 is a section view of the components which are illustrated in FIG. 5.
Figure 5:
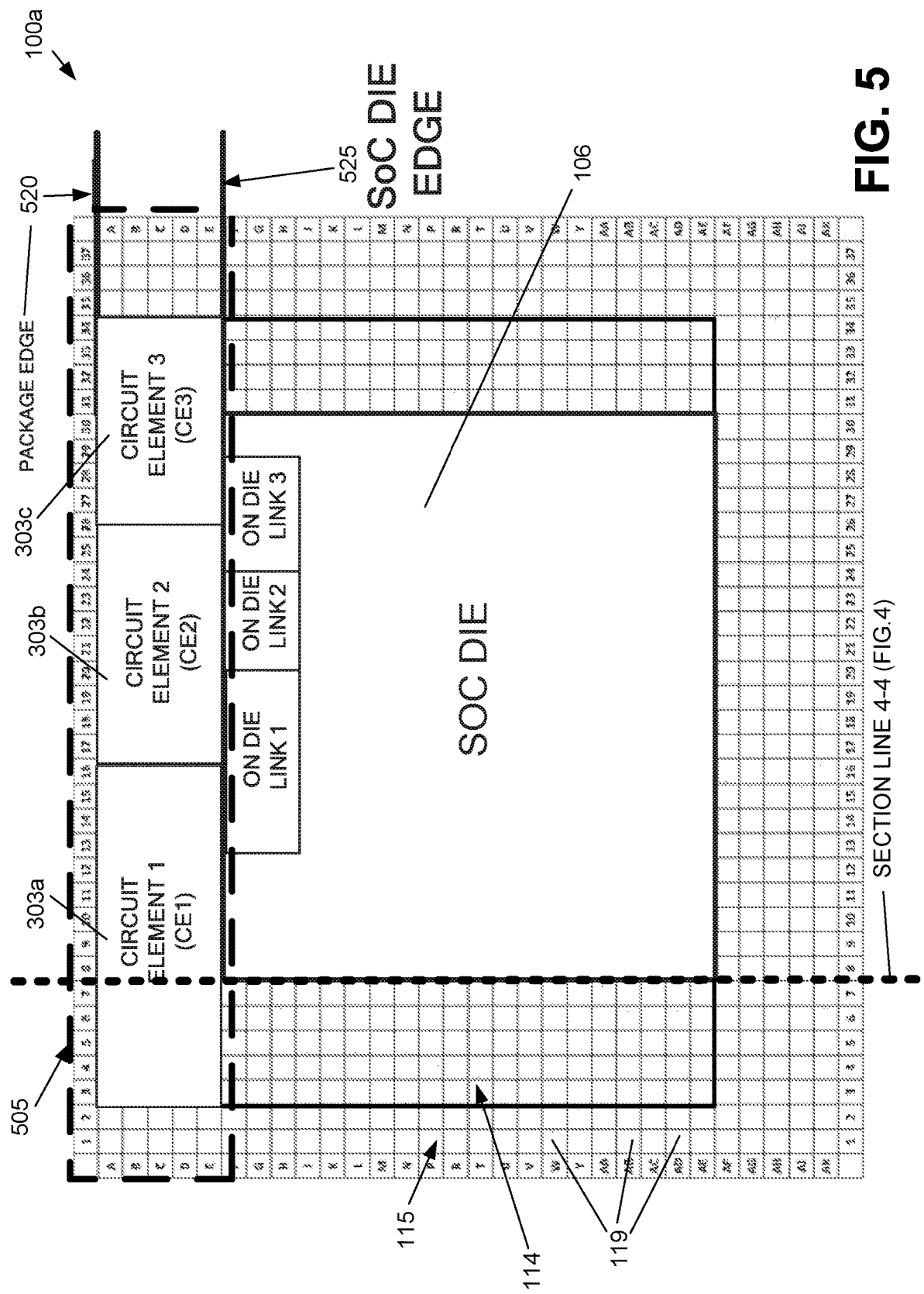
FIG. 5 illustrates an exemplary pin map for a top surface of the PCB shown in FIG. 4 and in FIG. 1, in which this pin map directly corresponds with the ball grid array illustrated in FIG. 3.

Referring now to FIG. 4, this figure is a sectional view of the components which are illustrated in FIG. 5 which has components 106, 303a-303c, 114. That is, FIG. 4 also illustrates a cross-sectional view of the PCB 114, substrate 124, CE1 303a, CE2 303b, and SoC D 106.

Inside IC package 100a as shown within the dashed line of FIG. 4, there is a first circuit element (CE1) 303a. A second circuit element (CE2) 303b and a third circuit element (CE3) 303c are not visible in FIG. 4, but are visible in FIG. 5 because CE1 303a, CE2 303b, and CE3 303c occupy the same geometric plane as visible in FIG. 5. The IC package 100a is coupled to a top surface 115 of a printed circuit board (PCB) 114. As shown in FIG. 4, the first circuit element (CE1) 303a is part of the substrate 125 and may have a portion of the BGA for the substrate 125.

Referring now to FIG. 5, this figure illustrates an exemplary pin map 505 (with Rows A-AK, and columns 1-37) from an elevational view (corresponding to vantage point 401 of FIG. 4) for a top surface 115 of the PCB shown in FIG. 4 and in FIG. 1 This pin 505 map directly corresponds with the ball grid array illustrated in FIG. 3 described above.

A dashed section line 4-4 is presented in FIG. 5. This section line 4-4 corresponds with the cross-sectional view of the IC package 100a illustrated in FIG. 4.

The pin map 505 of FIG. 5 comprises square units 119 that may represent pins 316. However, other shapes besides squares may be employed in the pin map without departing from this disclosure. For example, instead of square units 119, round shaped elements or circles could be employed in the pin map without departing from this disclosure.

As shown in this view of FIG. 5, the IC package 100b has the first circuit element (CE1) 303a as shown in FIG. 4 as well as a second circuit element (CE2) 303b, and a third circuit element (CE3) 303b (not visible in the cross-sectional view of FIG. 4). Each circuit element (CE) 303 may include, but is not limited to, circuit traces or data paths, conductors, a processing entity, including, but not limited to, another SoC, processing circuits (i.e. radio-frequency ICs, such as modems, baseband ICs), memory circuits, or any combination thereof.

Figure 12:
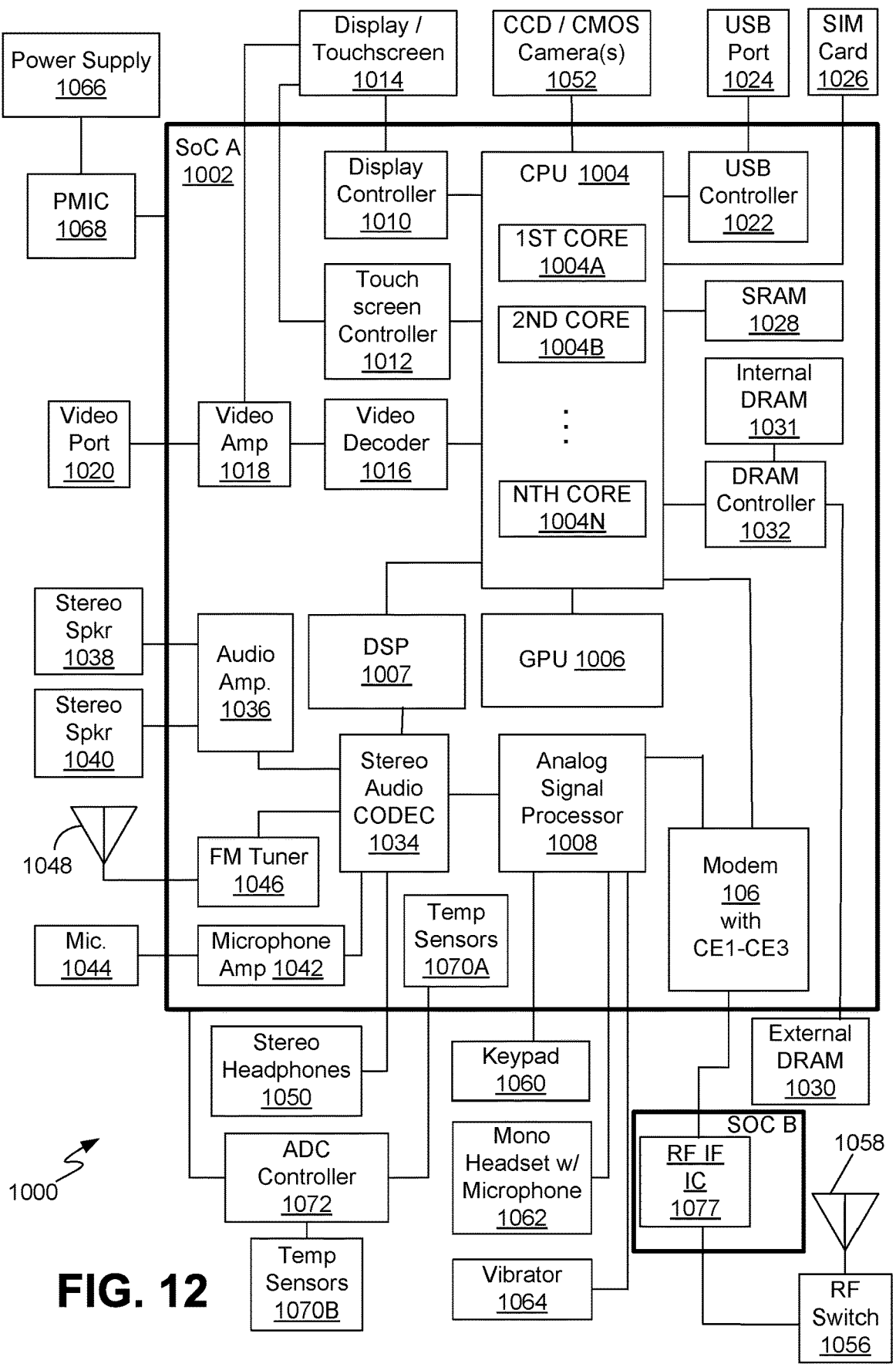
FIG. 12 illustrates an exemplary embodiment of a PCD, such as a mobile telephone, which may employ the pin maps of FIGS. 7-11 between certain chips.
Figure 13:
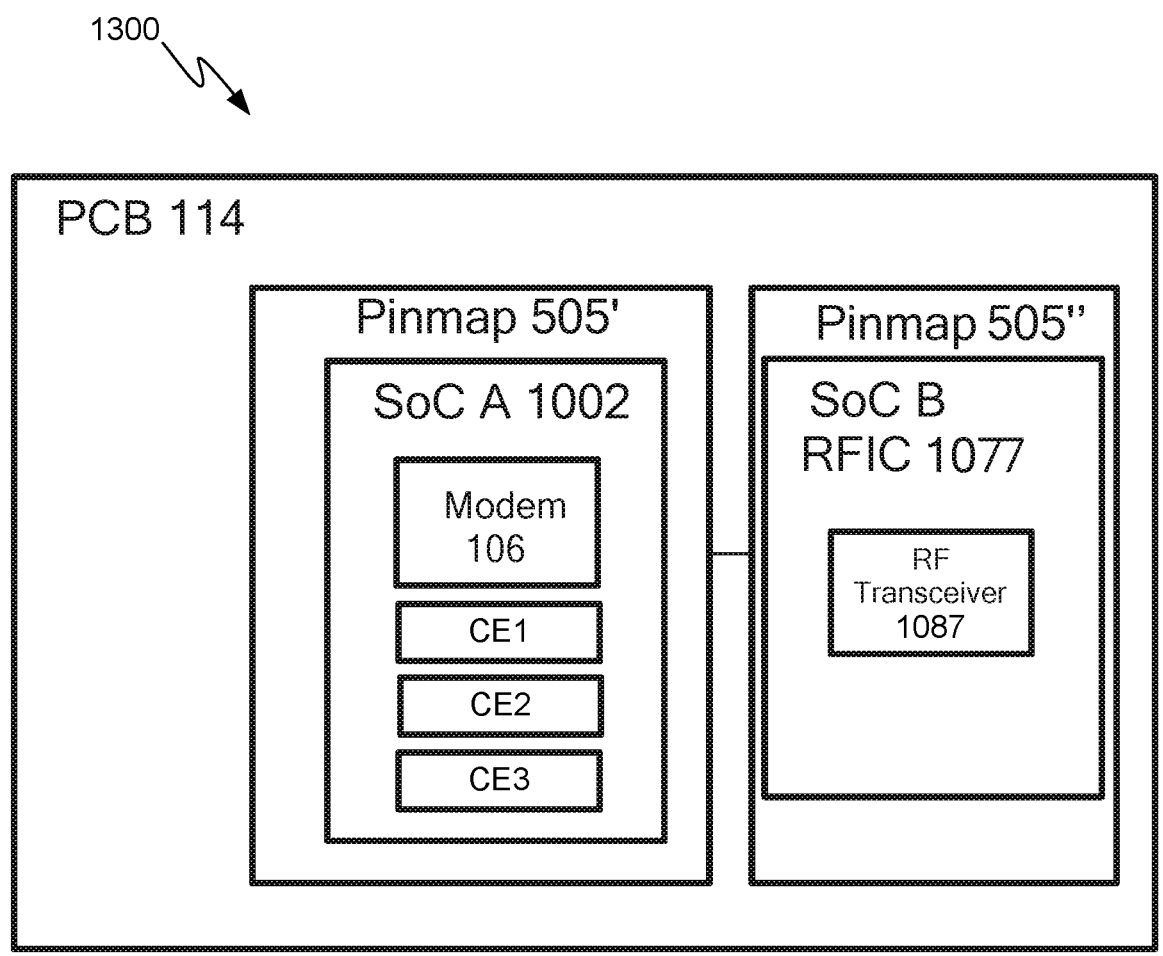
FIG. 13 is a functional block diagram illustrating one possible physical layout for a modem SoC Die and an RF IF IC SoC.

The CEs 1-3 303, according to one exemplary embodiment illustrated in FIG. 5, may comprise one or more interface circuits that couple the modem die 106 to intermediate frequency (IF) integrated circuits (ICs) 1077, as illustrated in FIG. 12 and FIG. 13 described below. The three circuit elements (CEs1-3) are connected to on die links (On Die Links 1-3) through interconnects on/within the substrate 125 (see FIG. 1) which are inside the package 100a and which are part of the SoC Die 106. These interconnects (not shown) within substrate 125 are similar in structure to the circuit traces 602 of the PCB 114 illustrated in FIG. 6 and described below.

A top section 505 of the pin map has been highlighted with dashed lines. This top section 505 of the pin map which corresponds to the three circuit elements (CEs 1-3) 303a-303c is a focus of the present disclosure. Specifically, the electrical polarity of the pins 316 represented by the square pin map units 119 within this top section 505 on the pin map is a focus of this disclosure. This top section 505 of the pin map has at least two boundary regions: the Soc Die edge 525 and the IC package edge 520.

However, it is noted that the SoC Die edge 525 may overlap the circuit elements CEs 1-3. Further, these two boundary regions defined by edges 520, 525 are not fixed. That is, the pin polarity patterns 505 (See FIGS. 7A, 8, and 9) corresponding to the the pin map and the pins 316 may be expanded beyond these boundary regions or contracted depending upon the size of the die package 100a and the PCB 114 needed for particular applications.

Figure 6:
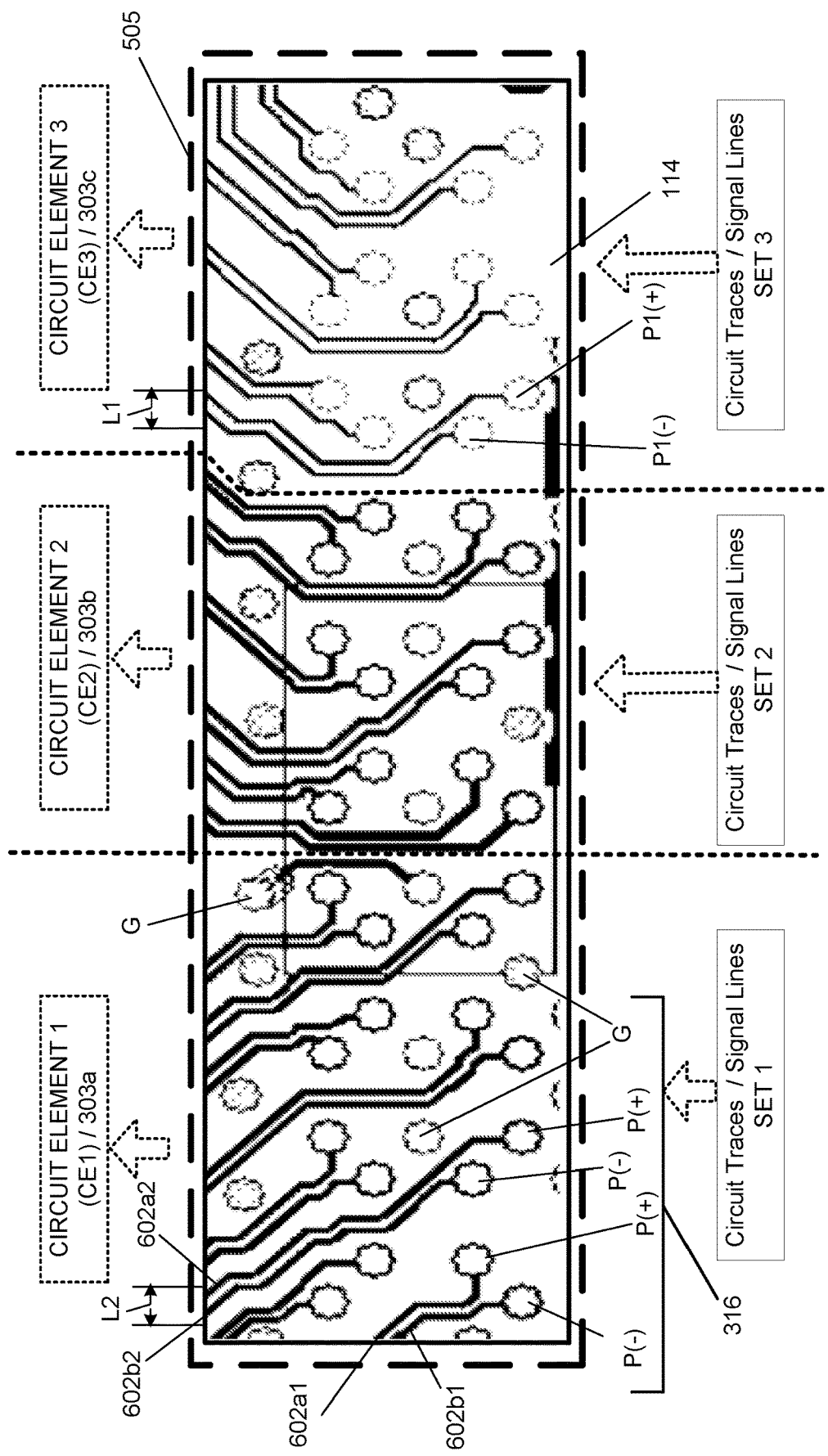
FIG. 6 illustrates a breakout routing for circuit traces on a PCB which correspond with a pin map, similar to the pin map of FIG. 5.

Referring now to FIG. 6, this figure illustrates a breakout routing for circuit traces 602 on a PCB 114 which corresponds with a pin map section 505, similar to the pin map section 505 of FIG. 5. A pin map section outline 505 shown with broken lines, similar to the one of FIG. 5, has been placed around PCB 114 to demonstrate that each square unit of pin map section 505 of FIG. 5 corresponds with the ends/pins 316 of circuit traces 602 found on and/or within the PCB 114. It is noted that the breakout routing for circuit traces 602 of FIG. 6 may or may not correspond directly with the pin maps section 505 described above in connection with FIG. 5.

At the ends of the circuit traces 602 are the pins 316 which correspond to pins 316 similar to those illustrated in FIG. 1 described above. The circuit traces 602 may form signal lines 602 which are coupled to circuit elements CEs 1-3 (303a-303c) shown in dashed lines at the top of FIG. 6 and corresponding to the CEs1-3 (303a-303c) illustrated in FIG. 5.

In the exemplary embodiment illustrated in FIG. 6, there are three sets of circuit traces/signal lines on PCB 114. The first set, Set 1, may couple with the first circuit element (CE1—303a) by the substrate 125 (see FIG. 4). Similarly, the second set, Set 2, may couple with the second circuit element (CE2—303b) by the substrate 125 (see FIG. 4). And the third set, Set 3, may couple with the third circuit element (CE3—303c) by the substrate 125 (see FIG. 4) as illustrated by the three dashed arrows in the upper portion of FIG. 6.

The inventive system is not limited to the three circuit element CEs 1-3 (303a-303c) illustrated. Fewer or additional sets of circuit traces/signal lines 602 may be provided to support fewer or additional circuit elements (CEs) without departing from this disclosure.

The signal lines 602 may support data signals, clock signals, etc. For example, if the signal lines 602 support communications between a modem die 106 and a RF intermediate-frequency (IF) integrated circuit (IC) 1077 (see FIGS. 12-13), the signal lines 602 may support uplink signals and downlink signals relative to the modem 106, as well as clock signals as understood by one of ordinary skill in the art.

Usually, the signals lines 602 are formed in signal pairs: a first signal line may have a positive (+)(plus) polarity while a second signal line may have a negative (−) (minus) polarity. For example, a first signal line pair 602a1, 602b1 may have a first signal line 602a1. The first signal line 602a1 may have a positive (+) polarity, while the second signal line 602b1 may have a negative (−) polarity. The end of the first signal line 602a1 may have a pin [P(+)] 316 which has a positive polarity. The end of the second signal line 602b1 may have a pin [P(−)] 316 which has a negative polarity.

Similarly, a second signal line pair 602a2, 602b2 may have a first signal line 602a2. The first signal line 602a2 may have a positive (+) polarity, while the second signal line 602b2 may have a negative (−) polarity. The end of the first signal line 602a2 may have a pin [P(+)] 316 which has a positive polarity. The end of the second signal line 602b2 may have a pin [P(−)] 316 which has a negative polarity.

These pairs of signal lines 602 may be coupled to the circuit element (CEs 1-3)(303a-303c) illustrated with dashed lines at the top of the page in FIG. 6. The pins 316 of these signal lines 602 may couple to the dies 106 and PEs1-3 (303a-303c) (see FIG. 5) via a ball grid array (BGA) as illustrated in FIGS. 1-5. Some of the pins 316 may not have any signal lines 602 and may comprise an electrical ground (G) relative to the PCB 114, the circuit elements (CEs), and dies 102, 104. If a space in the pin map does not have an electrical designation, then it may comprise an empty space/plain portion of the printed circuit board (PCB). In alternative embodiments, a space in the pin map without an electrical designation may comprise a pin, but that pin may not be connected to anything/not connected to any circuit element and may be characterized as floating relative to the electrical designations noted above.

The PCB 114 may comprise a plurality of lanes L. For example, see lane L1 which is defined by two pins P1(+), P1(−) of opposite polarity and corresponding to the two signal lines/traces that traverse across the PCB 114. See lane L2 which is defined by two pins P(+), P(−) and signal line pair 602a2, 602b2.

Referring now to FIG. 7A, this figure illustrates a first exemplary embodiment of a pin map 505A for a ball grid array (BGA) coupling, similar to the pin map 505 illustrated in FIG. 5 described above. As described above in connection with FIG. 6, each pin 316 of a pin map 505 may be coupled to an end of a circuit trace/signal line 602 on/within the PCB 114. And each pin 316 may comprise at least one of a positive polarity pin [P(+)], a negative polarity pin [P(−)], and a ground pin [G]. And for portions of the pin map 505 which are blank or do not have any pin designations, these portions are empty/blank regions of the PCB 114 which have neither pins 316 nor traces/signal lines 602. That is, empty or blank squares/units of the pin map 505 mean that this area comprises a substrate material and does not have any pins 316, conductors, circuit traces/signal lines 602.

Generally, the signal lines 602 and pins 316 (see FIG. 6) will form signal line pairs having opposite polarities. That is, for each pair of pins 316, the pair will comprise a positive polarity pin [P(+)] and negative polarity pin [P(−)], where the pair of pins will occupy diagonally opposing squares of the pin map 505. In other words, each pin having a polarity will occupy a space that is forty-five degrees off-set relative to its mating pin of the pin pair. And it is noted that the polarity for a pin of any given pin pair may be swapped/reversed.

Meanwhile, ground pins G typically are not paired with other ground pins G. Ground pins G are not required to be off-set relative to another ground pin G by forty-five degree angles. Though, depending upon a particular pin polarity pattern, it is possible that pairs of ground pins G are off-set by forty-five degrees, but they are not generally required to be in this orientation. Also, ground pins G can be positioned within the pin map 505 without being paired with another ground pin G.

Similar to the breakout routing for the signal lines 602 illustrated in FIG. 6, the pin map 505A may support communications with the three CEs 1-3 (303a-303b). However, fewer or additional CEs 1-3 (303a-303b) may be coupled based on the pin map 505 and are included within the scope of this disclosure.

The pin map 505A may comprise a repeating pin polarity pattern 555A1-A4. This first repeating pin polarity pattern 555 may have a substantially square shape when a region comprising a four pin by four pin area is selected. This first repeating pin polarity pattern 555 will be referred to as a lane unit tile. There are two types of lane unit tiles 555 for the pin map 505A: SoC die edge types (lower) 555A1-A2 and a package edge type (upper) 555A3-A4.

For the SoC die edge types of the lane unit tiles 555A1-555A2, the bottom row of the 4×4 unit square includes pin map units below the SoC die edge 520. Further, the SoC die edge types of lane unit tiles 555A1-555A2 may have at least four ground pins (G) present in outer twelve positions (squares) relative to the four inner positions (squares) that include the lane or signal pair [P(+),P(−)].

Meanwhile, for the package edge types of the lane unit tiles 555A3-555A4, the top row of the 4×4 unit square includes pin map units above the IC package edge 525. Further, the package edge types of lane unit tiles 555A3-555A4 may have up to six ground pins (G) present in outer twelve positions (squares) relative to the four inner positions (squares) that include the lane or signal pair [P(+),P(−)].

It is noted that not all lane unit tiles 555 were highlighted in FIG. 7A. As mentioned above, a lane unit tile 555 is first identified by its lane or signal pair pins P(+), P(−) of opposite polarities and then the tile includes the outer four by four square pin map units relative to the inner two by two pin map square unit that include the signal pair or lane L.

Referring now to FIG. 7B, this figure illustrates a magnification of the first square shaped, lane unit tile/repeating pin polarity pattern 555A1 highlighted in FIG. 7A. According to this square shaped lane unit tile/repeating pin polarity pattern 555A1, the four most inner square units having an area of two by two pins may comprises a pin pair of opposite polarities P(+), P(−) which form a lane L positioned at a forty-five degree angle. Specifically, the positive polarity pin P(+) may occupy the position R4, C8 of the inner four squares, while the negative polarity pin P(−) may occupy the position R5, C9 of the inner four squares.

With respect to the outer twelve outside squares [R3, C7-C8; R4, C7 &C10; R5, C7 & C10; and R6, C7-C10] of the four by four square shaped repeating pin polarity pattern (lane unit tile) 555A1, the pattern may comprise a ground pin G located at positions [R3, C7]; [R3, C9]; [R4, C10]; and [R5, C7]. While not illustrated in FIGS. 7A and 7B, the sixth row (R6) may include two additional ground pins G, such that the lane or signal pair [P(+), P(−)] may be surrounded by a total of six ground pins G. Meanwhile, the remaining outer twelve squares may comprise blanks/empty regions relative to these four ground pins G illustrated in this square shaped, lane unit pattern 555A1 of FIG. 7A.

As noted above, this lane unit tile 555A1 as well as the second tile 555A2 are of a SoC Die type since their lower row, here Row 6 of tile 555A1, includes pin map units below the SoC Die edge 520 as shown in FIG. 7A. Meanwhile, the other two lane unit tiles 555A3 and 555A4 are the IC package edge type since their top row includes units above the IC package edge 525.

Referring now to FIG. 8, this figure illustrates a second exemplary embodiment of a pin map 505A for a ball grid array (BGA) coupling, similar to the pin maps 505 illustrated in FIG. 5, and FIGS. 7A-7B described above. FIG. 8 is substantially similar to FIG. 7A.

FIG. 8 highlights four lane unit tiles 555B1-555B4. The first two lane unit tiles 555B1-B2 are SoC Die lane unit tiles (lower type) while the second two lane unit tiles 555B3-555B4 are the IC Package edge type (upper type), similar to the lane unit tiles 555A described in FIG. 7A. The main difference between the lane unit tiles 555 of FIG. 7A and FIG. 8 is that the polarity of the pins 316/signals at rows R4/R5 of FIG. 8 are shifted by one column to the right whereas the polarity of the pins 316/signals at rows R1/R2 of FIG. 8 are kept the same relative to FIG. 7A.

Referring now to FIG. 9, this figure illustrates a magnification of the square shaped repeating lane unit tile/pin polarity pattern 555B1 highlighted in FIG. 8. FIG. 9 is substantially similar to FIG. 7B. Therefore, only the differences between these two figures will be described below. According to this square shaped repeating lane unit tile/pin polarity pattern 555B, the four most inner squares having an area of two by two pins may further define a lane unit that comprises a pin pair of opposite polarities P(+), P(−) positioned at a forty-five degree angle.

Specifically, the positive polarity pin P(+) of FIG. 9 may occupy the position R5, C31 of the inner four squares, while the negative polarity pin P(−) may occupy the position R4, C30 of the inner four squares. This exemplary embodiment for the square shaped repeating pin polarity pattern 555B1 of FIG. 9 is a literal polar opposite to the exemplary embodiment of FIG. 7B with respect to the four-most inner squares of the patterns 555. In other words, within a lane unit tile 555, the polarity of the signal pairs [P(−), P(+)] may be swapped/switched.

Figure 10:
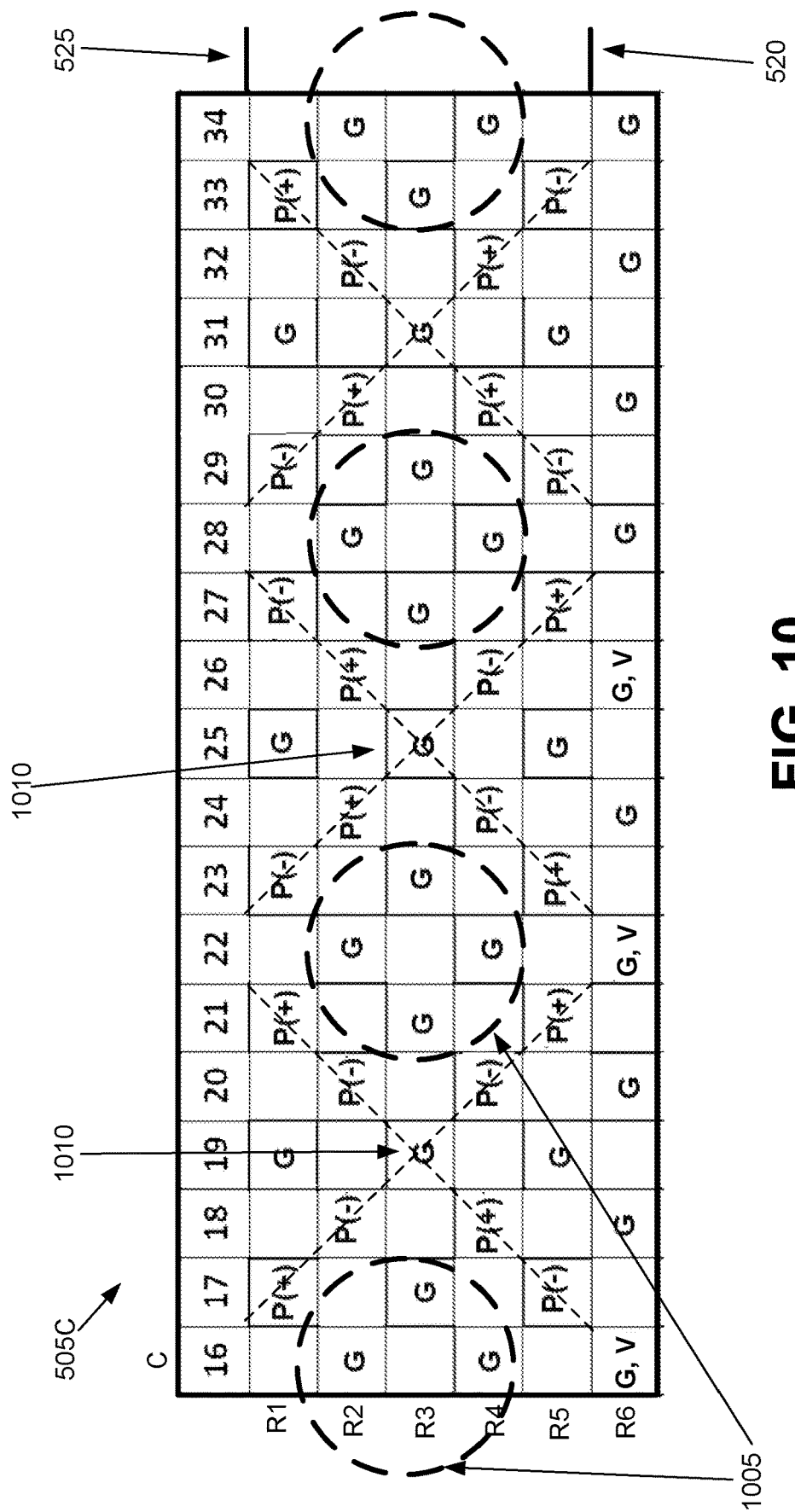
FIG. 10 illustrates a third exemplary embodiment of a pin map for a ball grid array (BGA) coupling, similar to the pin maps illustrated in FIG. 5, and FIGS. 7A-9.

Also, in some exemplary embodiments (not illustrated), this sixth row R6 of FIG. 9 may comprise either additional ground pins G or a power pin (V) (see FIG. 10, specifically row R6, columns C16, C22, C26). Power pins (V), like ground pins G, usually do not support any communications or data signals, and thus, power pins (V) are usually not positioned in pairs.

Referring back to FIG. 8, the lower two lane unit tiles 555B1, 555B2 of FIG. 8 may comprise SoC die edge type patterns where their respective bottom rows of the unit tile 555 are below the SoC die edge 520, similar to the first two lane unit tiles 555A1, 555A2 of FIG. 7A. The upper two lane unit tiles 555B3, 555B4 may comprise IC package edge type patterns where their respective top rows of the tile 555 are above the IC package edge 525, similar to the second two lane unit tiles 555A3, 555A4 of FIG. 7A.

Referring now to FIG. 10, this figure illustrates a pin map 505C which has the same pin polarity shown in FIG. 7A. However, FIG. 10 illustrates a repeating pin polarity pattern of circles 1005 and "X's" 1010. That is, the repeating pin polarity pattern 1005 shaped like each circle may comprise four ground (G) pins centered around the third Row3. Meanwhile, the repeating pin polarity pattern 1010 shaped like each "X" may comprise a ground pin G forming the "center" of each "X" shape, while the remaining pins along the diagonal of each line forming the "X" shape may comprise positive pins [P(+)] and negative pins [P(−)].

In the sixth row of pin map 505C of FIG. 10, and specifically, in the sixth row and sixteenth column (R6, C6); sixth row and twenty-second column (R6, C22); and in the sixth row and twenty-sixth column (R6, C26), these three locations of the pin map 505C may comprise either ground pins (G) or a power supply pin (V), according to one exemplary application. A power supply pin (V), like a ground pin (G), usually does not propagate any communication/data signals and thus, is not paired with another pin. This sixth row (R6) of FIG. 10 is below the die edge 520.

Figure 11:
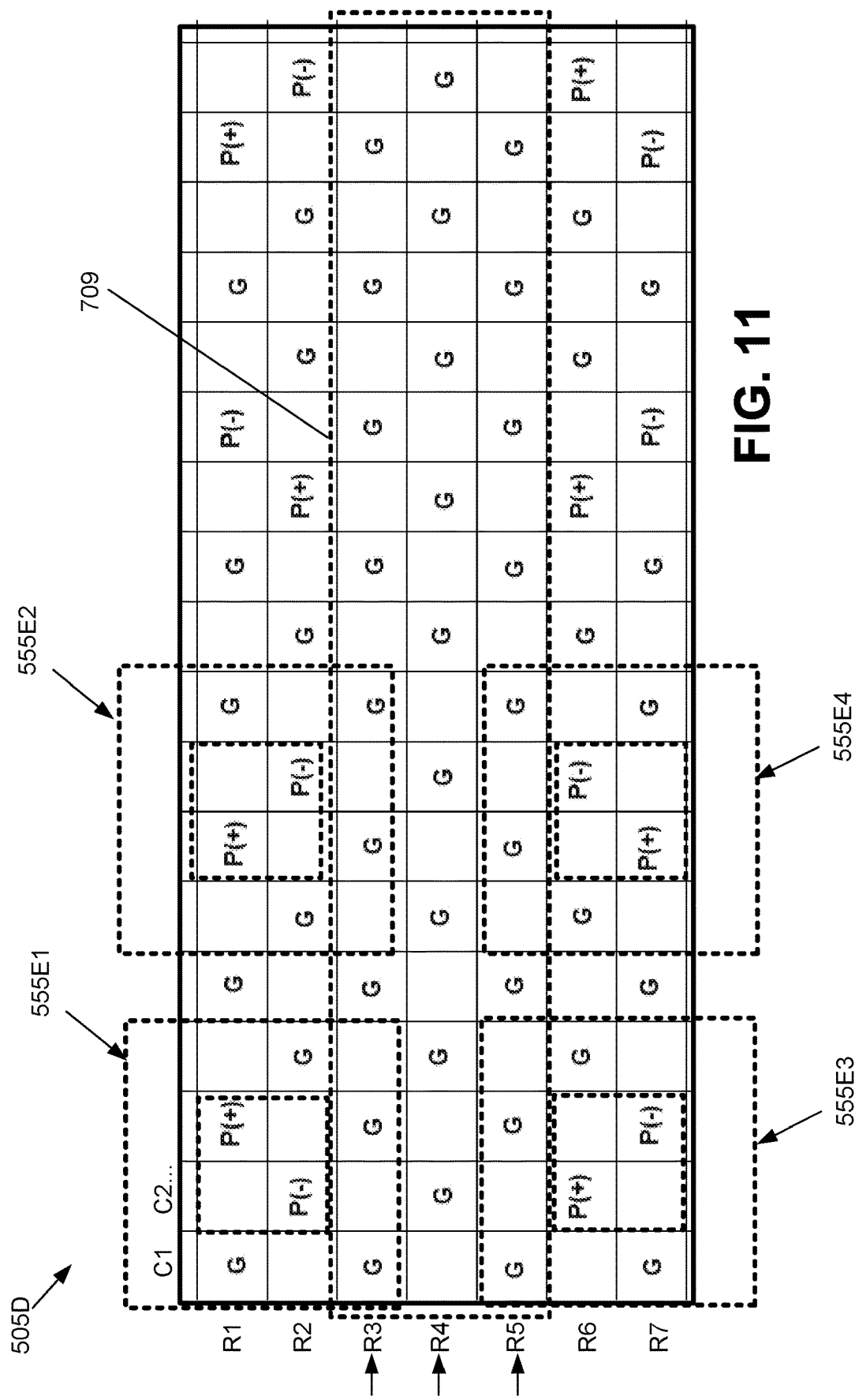
FIG. 11 illustrates a fourth exemplary embodiment of a pin map for a ball grid array (BGA) coupling, similar to the pin maps illustrated in FIGS. 5, and 7-9.

Referring now to FIG. 11, this figure illustrates a fourth exemplary embodiment of a pin map 505D for a ball grid array (BGA) coupling, similar to the pin maps 505A, 505B illustrated in FIGS. 5, 7A, and 8. The fundamental lane unit tile pattern 555E is still present in FIG. 11. The difference compared to FIGS. 7A and 8 is that the lane unit tile patterns 555E are not overlapping each other compared to other examples noted above.

Since the lane unit tiles 555E of FIG. 11 do not overlap, there is more physical separation between signal pairs/lanes. The lack of overlap between tile patterns 555E may determine the "sparseness" of the entire pin-pattern for the pin map 505D. The pin map 505D of FIG. 11 may be characterized as having a more sparse repeating pin polarity pattern compared to the repeating pin patterns of FIGS. 7A, 7B, 8, 9, and 10.

In this exemplary embodiment of FIG. 11, there are three ground pin (G) rows R3-R5 highlighted with a rectangular box 709. These ground pin (G) rows R3-R5 help provide additional spacing.

This additional spacing and ground pins (G) allow the signal pairs/lanes to support higher frequency signals compared to the other exemplary embodiments. In the scenario when the pitch between pins is reduced (see Dc1, Dc2 as shown in FIG. 3), these additional ground pins (G) between unit lane tiles 555E allow signal pairs [P(+), P(−)] to stay further apart.

It is noted that other repeating pin polarity patterns are present in the pin maps 505 of the FIGS. 7-11, however, only a few repeating patterns were highlighted in this text for brevity.

Performance Achieved with Exemplary Pin Maps 505

The pin map systems described above allow circuit traces or signal lines to be formed on a single/one layer or geometric plane of a PCB, providing the design rules used for PCB traces and Via sizes allow such geometries. In this way, with a single PCB layer having well-mapped traces/signal lines, multiple PCB layers are not needed to support communications between two dies and/or two integrated circuits or a combination thereof. Thus, the pin map system enables PCB routing to be contained within a single signal layer to maximize board routing space on a PCB.

The pin map system described above may reduce cross-talk between traces/signal lines within the PCB 114. For example, the pin map may reduce cross-talk by about 5.0 to 10.0 dB for RF-communication signals propagating at Nyquist frequency of about 9 GHz. The pin map system is scalable by adding more ground electrical designations (G) in between rows and columns of positive and negative polarity pins [P(+), P(−)]. The pin map system is scalable for multiple lane counts and it provides an easy and intuitive guide for PCB and electronic package routing.

The pin map system is scalable for different electronic package pitch sizes, provided the PCB trace and Via design rules scale or meet the requirements for the PCB fanout strategy described above. Socketed platforms use a socket to be able to swap out parts for volume system level testing. The socket between the BGA and system level test (SLT) platform PCB typically has additional margin for cross-talk while operating at target operating frequencies.

The pin map system described above may enhance the margin for a socketed platform to meet the design target (especially at these high data rates) and the system level tests are not limited by BGA/socket interface while testing system performance. On system SLT platforms, the pin map system is helpful for volume production and quality control. The pin map system may be used with industry standard interfaces, such as PCIE, USB, etc.

The pin map system is especially helpful for low voltage RF-communication applications, such as those for portable computing devices (PCDs), like mobile phones, operating on batteries. For example, the voltage across the pin map system may comprise a magnitude of 800.0 mV. 800.0 mV signals may become corrupted by 1.0 V cross-talk signals, which is a very low threshold. PCDs may include, but are not limited to, a mobile telephone, as mentioned above, a personal digital assistant (PDA), a pager, a smartphone, a navigation device, and a hand-held computer with a wireless connection or link. The pin map system may also be used in laptops and desktop computers in addition to PCDs.

Referring now to FIG. 12, this figure illustrates an exemplary embodiment of a PCD 1000, such as a mobile telephone, which may employ the pin maps 505 of FIGS. 7-11 between certain chips such as between a modem 106 and radio-frequency (RF) intermediate frequency (IF) integrated circuit (IC) 1077. The PCD 1000 includes an SoC 1002.

In the SoC 1002 embodiment, the SoC 1002 may include a CPU 1004, a GPU 1006, a DSP 1007, an analog signal processor 1008, or other processors. The CPU 1004 may include multiple cores, such as a first core 1004A, a second core 1004B, etc., through an Nth core 1004N.

A modem 106 may be coupled to the analog signal processor 1008. The modem may be coupled to an RF-IF IC 1077 by a PCB 114 (not shown), where PCB 114 provides a mating surface for SoC 1002 and a second SoC B containing the RF IC 1077. The PCB 114 may comprise the pin map 505 for supporting a ball grid array (BGA) coupling as illustrated in FIGS. 5, and 7-11.

The PCB 114 with its pin map 505 (not visible in FIG. 12) may be part of a Serial/Deserializer (SERDES) circuit that supports RF signals between the modem 106 and RF-IF IC 1077. An RF switch 1056 may be coupled to the RF IF IC 1077 and an RF antenna 1058.

In addition, a keypad 1060, a mono headset with a microphone 1062, and a vibrator device 1064 may be coupled to the analog signal processor 1008.

A display controller 1010 and a touchscreen controller 1012 may be coupled to the CPU 1004. A touchscreen display 1014 external to the SoC 1002 may be coupled to the display controller 1010 and the touchscreen controller 1012. The PCD 1000 may further include a video decoder 1016 coupled to the CPU 1004. A video amplifier 1018 may be coupled to the video decoder 1016 and the touchscreen display 1014. A video port 1020 may be coupled to the video amplifier 1018. A universal serial bus ("USB") controller 1022 may also be coupled to CPU 1004, and a USB port 1024 may be coupled to the USB controller 1022. A subscriber identity module ("SIM") card 1026 may also be coupled to the CPU 1004.

One or more memories 1028, 1031 may be coupled to the CPU 1004. The one or more memories may include both volatile and non-volatile memories. Examples of volatile memories include static random access memory ("SRAM") 1028 and dynamic RAMs ("DRAM's") 1030 and 1031. Such memories may be external to the SoC 1002, such as the DRAM 1030, or internal to the SoC 1002, such as the DRAM 1031. A DRAM controller 1032 coupled to the CPU 1004 may control the writing of data to, and reading of data from, the DRAMs 1030 and 1031. In other embodiments, such a DRAM controller may be included within a processor, such as the CPU 1004. The CPU 1004 may execute an HLOS or other software that is stored in any of the aforementioned memories.

A stereo audio CODEC 1034 may be coupled to the analog signal processor 1008. Further, an audio amplifier 1036 may be coupled to the stereo audio CODEC 1034. First and second stereo speakers 1038 and 1040, respectively, may be coupled to the audio amplifier 1036. In addition, a microphone amplifier 1042 may be coupled to the stereo audio CODEC 1034, and a microphone 1044 may be coupled to the microphone amplifier 1042. A frequency modulation ("FM") radio tuner 1046 may be coupled to the stereo audio CODEC 1034. An FM antenna 1048 may be coupled to the FM radio tuner 1046. Further, stereo headphones 1050 may be coupled to the stereo audio CODEC 1034. Other devices that may be coupled to the CPU 1004 include one or more digital (e.g., CCD or CMOS) cameras 1052.

A power supply 1066 may be coupled to the SoC 1002 via a power management integrated circuit ("PMIC") 1068. The power supply 1066 may include a rechargeable battery or a DC power supply that is derived from an AC-to-DC transformer connected to an AC power source.

The SoC 1002 may have one or more internal or on-chip thermal sensors 1070A and may be coupled to one or more external or off-chip thermal sensors 1070B. An analog-to-digital converter ("ADC") controller 1072 may convert voltage drops produced by the thermal sensors 1070A and 1070B to digital signals.

The touch screen display 1014, the video port 1020, the USB port 1024, the camera 1052, the first stereo speaker 1038, the second stereo speaker 1040, the microphone 1044, the FM antenna 1048, the stereo headphones 1050, the RF switch 1056, the RF antenna 1058, the keypad 1060, the mono headset 1062, the vibrator 1064, the thermal sensors 1050B, the ADC controller 1052, the PMIC 1068, the power supply 1066, the DRAM 1030, and the SIM card 1026 are external to the SoC 1002 as illustrated in this exemplary embodiment of a PCD 1000. It will be understood, however, that in other embodiments one or more of these devices may be included in an SoC.

Referring now to FIG. 13, this figure is a functional block diagram illustrating one possible physical layout 1300 for a modem SoC Die 106 and an RF IF IC 1077 SoC. According to this exemplary embodiment, the first SoC A 1002 may comprise the modem SoC 106 and the processing entities (PEs 1-3) described previously. This first SoC A package 1002 may be coupled to the PCB 114 using a BGA and a first pin map 505'.

Meanwhile, a second SoC B having the RF IF IC 1077 with a RF transceiver 1087 may also be coupled to PCB 114 using a BGA and a second pin map 505". The PCB 114 has circuit traces/signal lines which may provide the electrical connection between the modem die 106, PEs 1-3 residing in first SoC A and the RF transceiver die 1087 residing in the second SoC B 1077. The first and second pin maps 505', 505" may be identical relative to each other or they may be different depending upon the type of circuit elements 106, 1077 which are being coupled to each other.

Figure 14:
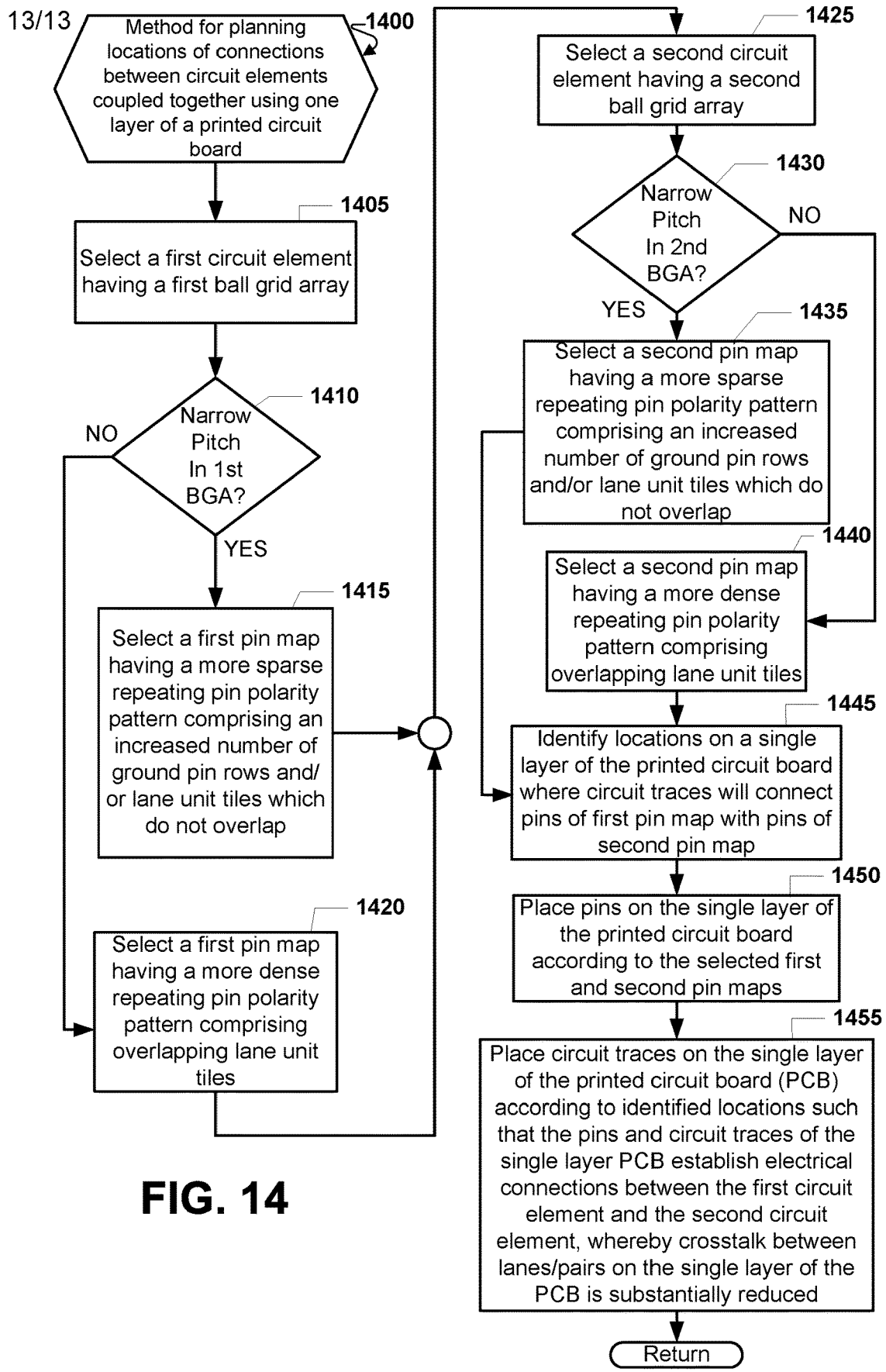
FIG. 14 is a logic flow chart illustrating an exemplary method for planning locations of connections between circuit elements coupled together using one layer of a printed circuit board.

As noted previously, the pin maps 505 allow for multiple circuit elements 106, 1077 to be coupled together using one layer of a printed circuit board 114 which has circuit traces 602 (not shown in FIG. 14, but see FIG. 6). Meanwhile, conventional solutions for coupling multiple circuit elements may require a plurality or more than one layer of a printed circuit board 114 to couple the circuit elements together.

Referring now to FIG. 14, this figure is a logic flow diagram illustrating an exemplary method 1400 for planning locations of connections between integrated circuit (IC) packages or circuit elements that are coupled together using a layer of a printed circuit board (PCB) 114. Block 1405 is the first block of method 1400.

In block 1405, a first circuit element 1002 (see FIG. 13) having a first ball grid array is selected for coupling to one layer of a printed circuit board 114. Next, in decision block 1410, it is determined if the pitch between conductors 116 (see FIG. 3) of a ball grid array (BGA) is narrow. As noted previously, in connection with FIG. 3, the conductors 116 of a BGA are arranged in rows and columns along the bottom surface of the IC package 100a. Each column (see letter designations AK-A at top of IC package 100a) of conductors 116 is positioned off-set relative to another column based on the diagonal distance Dc1 between conductors 116. Similarly, each row (see number designations 1-37 on side of IC package 100a) of conductors 116 is positioned off-set relative to another column based on the diagonal distance Dc1 between conductors 116 The diagonal distance Dc1 may have an exemplary magnitude of about 0.35 mm.

Meanwhile, the distance Dc2 between conductors 116 within the same row and within the same column may comprise an exemplary magnitude of 0.496 mm. Generally, the dimension Dc2 will be greater than the distance Dc1. If either distance Dc1 or Dc2 is less then these dimensions (i.e. Dc1<0.35 mm or Dc2<0.496 mm), then the pitch may be characterized as "narrow." Other magnitudes for dimensions Dc1 and Dc2 are possible, and are included within the scope of this disclosure.

So if the inquiry to decision block 1410 is "narrow," then the "YES" branch is followed to block 1415. If the inquiry to decision block 1410 is not narrow, meaning that the diagonal distances Dc1 and Dc2 are greater than or equal to the ones described in block 1405, then the "NO" branch is followed to block 1415.

In block 1415, a first pin map 505D (See FIG. 11) having a more sparse repeating pin polarity pattern comprising an increased number of ground pin rows (i.e. see rows R3-R5 of FIG. 11) and/or lane unit tiles 555E1-551E4 (FIG. 11) which do not overlap is selected. The pin map 505 for block 1415 generally corresponds to the exemplary embodiment illustrated in FIG. 11. As mentioned previously in connection with FIG. 11, since the lane unit tiles 555E of FIG. 11 do not overlap, there is more physical separation between signal pairs/lanes compared to those shown in FIGS. 7A, 8, 9, and 10. The lack of overlap between tile patterns 555E may determine the "sparseness" of the entire pin-pattern for the pin map 505D. The pin map 505D of FIG. 11 may be characterized as having a more sparse repeating pin polarity pattern compared to the repeating pin patterns of FIGS. 7A, 7B, 8, 9, and 10. In the exemplary embodiment of FIG. 11, there are three ground pin (G) rows R3-R5 highlighted with a rectangular box 709. These ground pin (G) rows R3-R5 help provide additional spacing between signal pairs/lanes. This additional spacing and ground pins (G) allow the signal pairs/lanes to support higher frequency signals compared to the other exemplary embodiments.

As noted above, if the inquiry to decision block 1405 is negative, meaning that the pitch of the BGA is not narrow or the BGA has an average pitch, then the "NO" branch is followed to block 1420. In block 1420, a first pin map having a more dense repeating pin polarity pattern (compared to FIG. 11) comprising overlapping lane unit tiles, such as those overlapping lane unit tiles illustrated in FIGS. 7A, 8, and 10 may be selected. That is, the pin map 505A of FIG. 7A which has overlapping lane unit tiles 555A1-A2, 555A3-A4, or the pin map 505B which has overlapping lane unit tiles 555B1-B2, 555B3-B4, or the pin map 505C of FIG. 10 which has repeating pin polarity patterns 1005, 1010 may be selected in block 1420.

The first pin map selected from either blocks 1415 or 1420 may correspond with the first pin map 505' for the first circuit element 1002 of FIG. 14.

Next, in block 1425, a second circuit element 1077 (see FIG. 13) having a second ball grid array (BGA) is selected for coupling to one layer of a printed circuit board 114. This block 1425 and the subsequent blocks 1430 through block 1440 are identical to blocks 1410-1420 (pitch 1410, sparse repeating pin polarity pattern 1415, dense repeating pin polarity pattern 1420). These blocks 1430 through block 1440 are made for the second BGA of the second circuit element 1077 of FIG. 13. Once the second pin map is determined for the second BGA based on either blocks 1435 or 1440, next, in block 1445 locations are then identified on the PCB 114 where circuit traces 602 (see FIG. 6) will connect pins of the first pin map 505' (see FIG. 13) with pins of the second pin map 505" (see FIG. 13).

And in block 1450, pins are then placed on a single layer of one printed circuit board 114 according to the first and second pin maps 505', 505". Next, in block 1455, the circuit traces are placed on a single layer of the printed circuit board 114 according to the locations identified in block 1445 such that the pins and circuit traces of the single layer of the printed circuit board 114 establish electrical connections between the first circuit element 1002 (see FIG. 13) and the second circuit element 1077 (see FIG. 13), whereby any potential crosstalk and/or interference between lanes/pairs of circuit traces 602 is substantially reduced. The method 1400 may then be repeated for the next circuit element that is to be coupled to the first circuit element 1002 and/or the second circuit element 1077, which both reside on the same PCB 114.

Alternate exemplary embodiments will become apparent to one of ordinary skill in the art to which this disclosure pertains without departing from its scope. For example, other applications of this inventive pin map system beyond mobile phone applications include using the inventive system for an add-on PCB card or a solder down module onto a larger motherboard in systems like laptops, Internet-of-Things (IoT), and in other similar telematics hardware/electronic packaging arrangements.

Implementation examples are described in the following numbered clauses:

1. An apparatus comprising: a first semiconductor die stacked vertically relative to a printed circuit board (PCB), the first semiconductor die coupled to the PCB with a ball grid array (BGA); a second semiconductor die stacked vertically relative to the printed circuit board (PCB), the second semiconductor die coupled to the PCB in a ball grid array (BGA) flip chip arrangement; a pin map corresponding to each ball grid array and covering a surface area of the PCB, the pin map comprising a plurality of electrical designations for each pin in the pin map and a plurality of empty spaces within the pin map; each electrical designation of the plurality of electrical designations on the pin map comprising one of a positive polarity (P+), a negative polarity (P−), or an electrical ground (G); each pin map including a first repeating pin polarity pattern; the first repeating pin polarity pattern comprising a lane unit tile, the lane unit tile having a central region defined by four pin map units, two of the four pin map units comprising two pins corresponding to a signal lane within the PCB.

2. The apparatus of clause 1, wherein the pin map comprises a plurality of square units wherein each square unit represents the electrical designation of a pin or an empty space.

3. The apparatus of any clauses 1-2, wherein the lane unit tile has one pin of positive polarity (P+) and one pin of negative polarity (P−) and the remaining two subregions of the central region comprises two empty spaces of the pin map.

4. The apparatus of any clauses 1-3, wherein the lane unit tiles overlap each other along a length dimension of the pin map.

5. The apparatus of any clauses 1-3, wherein the lane unit tiles do not overlap each other along a length dimension of the pin map.

6. The apparatus of any clauses 1-5, wherein the pin map comprises two boundaries: a first boundary corresponds to an integrated circuit (IC) package edge and a second boundary corresponds to a die edge.

7. The apparatus of any clauses 1-6, wherein the semiconductor die comprises at least one of: an integrated circuit (IC), a system-on-chip (SoC), a serializer/deserializer (SERDES) interface, a modem, a baseband IC, and a memory circuit, or a combination thereof.

8. The apparatus of clause 7, wherein the PCB supports radio-frequency (RF) communications.

9. The apparatus of clause 8, wherein the PCB is contained within a portable computing device which comprises at least one of: a mobile telephone, a personal digital assistant (PDA), a pager, a smartphone, a navigation device, and a hand-held computer with a wireless connection or link.

10. An apparatus comprising: a pin map corresponding to a ball grid array and covering an entire surface area of a layer of a printed circuit board (PCB), the pin map comprising a plurality of electrical designations for each pin in the pin map and a plurality of empty spaces within the pin map; each electrical designation of the plurality of electrical designations comprising one of a positive polarity (P+), a negative polarity (P−), or an electrical ground (G); and the pin map including a first repeating pin polarity pattern; the first repeating pin polarity pattern comprising a lane unit tile, the lane unit tile having a central region defined by four pin map units, two of the four pin map units comprising two pins corresponding to a signal lane within the PCB 11. The apparatus of clause 10, further comprising a semiconductor die stacked vertically relative to the PCB, the die being coupled to the PCB with the ball grid array (BGA) in a flip chip arrangement.

12. The apparatus of any clauses 10-11, wherein the pin map comprises a plurality of square units wherein each square unit represents the electrical designation of a pin or an empty space.

13. The apparatus of any clauses 10-12, wherein the lane unit tile has one pin of positive polarity (P+) and one pin of negative polarity (P−) and the remaining two subregions of the central region comprises two empty spaces of the pin map.

14. The apparatus of any clauses 10-13, wherein the lane unit tiles overlap each other along a length dimension of the pin map.

15. The apparatus of any clauses 10-13, wherein the lane unit tiles do not overlap each other along a length dimension of the pin map.

16. The apparatus of any clauses 10-15, wherein the pin map comprises two boundaries: a first boundary corresponds to an integrated circuit (IC) package edge and a second boundary corresponds to a die edge.

17. The apparatus of clause 11, wherein the semiconductor die comprises at least one of: an integrated circuit (IC), a system-on-chip (SoC), a serializer/deserializer (SERDES) interface, a modem, a baseband IC, and a memory circuit, or a combination thereof.

18. The apparatus of any clauses 10-17, wherein the PCB supports radio-frequency (RF) communications.

19. The apparatus of clause 17, wherein the PCB is contained within a portable computing device which comprises at least one of: a mobile telephone, a personal digital assistant (PDA), a pager, a smartphone, a navigation device, and a hand-held computer with a wireless connection or link.

20. The apparatus of clause 18, wherein the PCB is contained within a portable computing device which comprises at least one of: a mobile telephone, a personal digital assistant (PDA), a pager, a smartphone, a navigation device, and a hand-held computer with a wireless connection or link.

21. An apparatus comprising: integrated circuit means for propagating high-speed communication signals stacked vertically relative to a layer of a printed circuit board (PCB), the integrated circuit means being coupled to the PCB with a ball grid array (BGA); a pin map corresponding to the ball grid array and covering a surface area of the PCB, the pin map comprising a plurality electrical designations for each pin in the pin map and a plurality of empty spaces within the pin map; each electrical designation of the plurality of electrical designations comprising one of a positive polarity (P+), a negative polarity (P−), or an electrical ground (G); the pin map including a first repeating pin polarity pattern; the first repeating pin polarity pattern comprising a lane unit tile, the lane unit tile having a central region defined by four pin map units, two of the four pin map units comprising two pins corresponding to a signal lane within the PCB.

22. The apparatus of clause 21, wherein the integrated circuit means comprises semiconductor dies stacked vertically relative to the PCB.

23. The apparatus of any clauses 21-22, wherein the pin map comprises a plurality of square units wherein each square unit represents the electrical designation of a pin or an empty space.

24. The apparatus of any clauses 21-23, wherein the lane unit tile has one pin of positive polarity (P+) and one pin of negative polarity (P−) and the remaining two subregions of the central region comprises two empty spaces of the pin map.

25. The apparatus of any clauses 21-24, wherein the lane unit tiles overlap each other along a length dimension of the pin map.

26. The apparatus of any clauses 21-24, wherein the lane unit tiles do not overlap each other along a length dimension of the pin map.

27. The apparatus of any clauses 21-26, wherein the pin map comprises two boundaries: a first boundary corresponds to an IC package edge and a second boundary corresponds to a die edge.

28. The apparatus of clause 22, wherein each semiconductor die comprises at least one of: an integrated circuit (IC), a system-on-chip (SoC), a serializer/deserializer (SERDES) interface, a modem, a baseband IC, and a memory circuit, or a combination thereof.

29. The apparatus of any clauses 21-28, wherein the PCB supports radio-frequency (RF) communications.

30. The apparatus of clauses 21-29, wherein the PCB is contained within a portable computing device which comprises at least one of: a mobile telephone, a personal digital assistant (PDA), a pager, a smartphone, a navigation device, and a hand-held computer with a wireless connection or link.

31. A method comprising: selecting a first circuit element having a first ball grid array; determining if the first ball grid array comprises a narrow pitch; selecting a first pin map having a sparse repeating pin polarity pin pattern if the first ball grid array comprises a narrow pitch; selecting a second circuit element having a second ball grid array; determining if the second ball grid array comprises a narrow pitch; selecting a second pin map having a sparse repeating pin polarity pin pattern if the second ball grid array comprises a narrow pitch; identifying locations on a layer of a printed circuit board where circuit traces will connect pins of first pin map with pins of second pin map; placing pins on the layer of the printed board according to the selected first and second pin maps; and placing circuit traces on the layer of the printed circuit board according to the identified locations such that pins and circuit traces of the layer of the printed circuit board establish electrical connections between the first circuit element and the second circuit element, whereby crosstalk between circuit traces on the layer of the printed circuit board is substantially reduced.

32. The method of clause 31, further comprising selecting a first pin map having a dense repeating pin polarity pattern if the first ball grid array comprises a broad pitch.

33. The method of clause 31, further comprising selecting a second pin map having a dense repeating pin polarity pattern if the second ball grid array comprises a broad pitch.

34. The method of clause 31, wherein the first and second pin maps comprise lane unit tiles which do not overlap.

35. The method of clause 31 or 34, wherein the first and second pin maps comprise ground pin rows which are positioned adjacent to each other.

36. The method of clauses 31 or 32, wherein the first pin map comprises overlapping lane unit tiles.

37. The method of clause 33, wherein the second pin map comprises overlapping lane unit tiles.

38. The method of clauses 34 or 36, wherein each lane unit tile has one pin of positive polarity (P+) and one pin of negative polarity (P−) and the remaining two subregions of the central region comprises two empty spaces of the pin map.

39. The method of clauses 31-38, wherein each circuit element comprises at least one of: an integrated circuit (IC), a system-on-chip (SoC), a serializer/deserializer (SERDES) interface, a modem, a baseband IC, and a memory circuit, or a combination thereof.

40. The method of clauses 31-39, wherein the layer of the printed circuit board is contained within a portable computing device which comprises at least one of: a mobile telephone, a personal digital assistant (PDA), a pager, a smartphone, a navigation device, and a hand-held computer with a wireless connection or link.

Therefore, although selected aspects have been illustrated and described in detail, it will be understood that various substitutions and alterations may be made therein without departing from the scope of this disclosure, as defined by the following claims.

What is claimed is:

1. An apparatus, comprising:
a first semiconductor die stacked vertically relative to a layer of a printed circuit board (PCB), the first semiconductor die coupled to the PCB with a ball grid array (BGA);
a second semiconductor die stacked vertically relative to the layer of the PCB, the second semiconductor die coupled to the PCB with a BGA;
a pin map corresponding to each BGA and covering a surface area of the PCB, the pin map comprising a plurality of electrical designations for each pin in the pin map and a plurality of empty spaces within the pin map; each electrical designation of the plurality of electrical designations on the pin map comprising one of a positive polarity (P+), a negative polarity (P−), or an electrical ground (G);
each pin map including a first repeating pin polarity pattern; the first repeating pin polarity pattern comprising a lane unit tile, the lane unit tile having a central region defined by four pin map units, two of the four pin map units comprising two pins corresponding to a signal lane within the PCB.

2. The apparatus of claim 1, wherein the pin map comprises a plurality of square units wherein each square unit represents the electrical designation of a pin or an empty space.

3. The apparatus of claim 1, wherein the lane unit tile has one pin of positive polarity (P+) and one pin of negative polarity (P−) and the remaining two subregions of the central region comprises two empty spaces of the pin map.

4. The apparatus of claim 3, wherein the lane unit tiles overlap each other along a length dimension of the pin map.

5. The apparatus of claim 3, wherein the lane unit tiles do not overlap each other along a length dimension of the pin map.

6. The apparatus of claim 1, wherein the pin map comprises two boundaries: a first boundary corresponds to an integrated circuit (IC) package edge and a second boundary corresponds to a die edge.

7. The apparatus of claim 1, wherein the semiconductor die comprises at least one of: an integrated circuit (IC), a system-on-chip (SoC), a serializer/deserializer (SERDES) interface, a modem, a baseband IC, and a memory circuit, or a combination thereof.

8. The apparatus of claim 7, wherein the PCB supports radio-frequency (RF) communications.

9. The apparatus of claim 8, wherein the PCB is contained within a portable computing device which comprises at least one of: a mobile telephone, a personal digital assistant (PDA), a pager, a smartphone, a navigation device, and a hand-held computer with a wireless connection or link.

10. The apparatus of claim 1, wherein the pin map comprises two boundaries: a first boundary corresponds to an IC package edge and a second boundary corresponds to a die edge.

11. An apparatus comprising:
a pin map corresponding to a ball grid array and covering a surface area of a layer of a printed circuit board (PCB), the pin map comprising a plurality of electrical designations for each pin in the pin map and a plurality of empty spaces within the pin map; each electrical designation of the plurality of electrical designations comprising one of a positive polarity (P+), a negative polarity (P−), or an electrical ground (G); and
the pin map including a first repeating pin polarity pattern; the first repeating pin polarity pattern comprising a lane unit tile, the lane unit tile having a central region defined by four pin map units, two of the four pin map units comprising two pins corresponding to a signal lane within the PCB.

12. The apparatus of claim 11, further comprising a semiconductor die stacked vertically relative to the PCB, the die being coupled to the PCB with the ball grid array (BGA).

13. The apparatus of claim 12, wherein the semiconductor die comprises at least one of:
an integrated circuit (IC), a system-on-chip (SoC), a serializer/deserializer (SERDES) interface, a modem, a baseband IC, and a memory circuit, or a combination thereof.

14. The apparatus of claim 13, wherein the PCB supports radio-frequency (RF) communications.

15. The apparatus of claim 14, wherein the PCB is contained within a portable computing device which comprises at least one of: a mobile telephone, a personal digital assistant (PDA), a pager, a smartphone, a navigation device, and a hand-held computer with a wireless connection or link.

16. The apparatus of claim 13, wherein the PCB is contained within a portable computing device which comprises at least one of: a mobile telephone, a personal digital assistant (PDA), a pager, a smartphone, a navigation device, and a hand-held computer with a wireless connection or link.

17. The apparatus of claim 11, wherein the pin map comprises a plurality of square units wherein each square unit represents the electrical designation of a pin or an empty space.

18. The apparatus of claim 11, wherein the lane unit tile has one pin of positive polarity (P+) and one pin of negative polarity (P−) and the remaining two subregions of the central region comprises two empty spaces of the pin map.

19. The apparatus of claim 18, wherein the lane unit tiles overlap each other along a length dimension of the pin map.

20. The apparatus of claim 18, wherein the lane unit tiles do not overlap each other along a length dimension of the pin map.

21. An apparatus comprising:
- integrated circuit means for propagating high-speed communication signals stacked vertically relative to a layer of the printed circuit board (PCB), the integrated circuit means being coupled to the PCB with a ball grid array (BGA);
- a pin map corresponding to the BGA and covering a surface area of the PCB, the pin map comprising a plurality electrical designations for each pin in the pin map and a plurality of empty spaces within the pin map; each electrical designation of the plurality of electrical designations comprising one of a positive polarity (P+), a negative polarity (P−), or an electrical ground (G);
- the pin map including a first repeating pin polarity pattern;
- the first repeating pin polarity pattern comprising a lane unit tile, the lane unit tile having a central region defined by four pin map units, two of the four pin map units comprising two pins corresponding to a signal lane within the PCB.

22. The apparatus of claim 21, wherein the integrated circuit means comprises semiconductor dies stacked vertically relative to the PCB.

23. The apparatus of claim 22, wherein each semiconductor die comprises at least one of:
- an integrated circuit (IC), a system-on-chip (SoC), a serializer/deserializer (SERDES) interface, a modem, a baseband IC, and a memory circuit, or a combination thereof.

24. The apparatus of claim 23, wherein the PCB supports radio-frequency (RF) communications.

25. The apparatus of claim 24, wherein the PCB is contained within a portable computing device which comprises at least one of: a mobile telephone, a personal digital assistant (PDA), a pager, a smartphone, a navigation device, and a hand-held computer with a wireless connection or link.

26. The apparatus of claim 21, wherein the pin map comprises a plurality of square units wherein each square unit represents the electrical designation of a pin or an empty space.

27. The apparatus of claim 21, wherein the lane unit tile has one pin of positive polarity (P+) and one pin of negative polarity (P−) and the remaining two subregions of the central region comprises two empty spaces of the pin map.

28. The apparatus of claim 27, wherein the lane unit tiles overlap each other along a length dimension of the pin map.

29. The apparatus of claim 27, wherein the lane unit tiles do not overlap each other along a length dimension of the pin map.

30. The apparatus of claim 21, wherein the pin map comprises two boundaries: a first boundary corresponds to an IC package edge and a second boundary corresponds to a die edge.

* * * * *